US008338317B2

(12) United States Patent
Engelhardt et al.

(10) Patent No.: US 8,338,317 B2
(45) Date of Patent: Dec. 25, 2012

(54) METHOD FOR PROCESSING A SEMICONDUCTOR WAFER OR DIE, AND PARTICLE DEPOSITION DEVICE

(75) Inventors: Manfred Engelhardt, Villach-Landskorn (AT); Hans-Joerg Timme, Ottobrunn (DE); Ivan Nikitn, Regensburg (DE); Manfred Frank, Nittendorf (DE); Thomas Kunstmann, Laaber (DE); Werner Robl, Regensburg (DE); Guenther Ruhl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 15 days.

(21) Appl. No.: 13/080,813

(22) Filed: Apr. 6, 2011

(65) Prior Publication Data

US 2012/0256323 A1 Oct. 11, 2012

(51) Int. Cl.
*H01L 21/00* (2006.01)

(52) U.S. Cl. . 438/798; 438/463; 438/513; 257/E21.121; 257/632; 359/265

(58) Field of Classification Search ........... 257/E21.121, 257/619, 620, 626, 632, 782; 438/113, 458, 438/459, 462, 463, 465, 513, 798, FOR. 117, 438/977; 359/265–267, 269, 270, 273, 275; 361/502, 504, 523, 524; 427/535; 428/612, 428/613
See application file for complete search history.

(56) References Cited

U.S. PATENT DOCUMENTS

| | | | | | |
|---|---|---|---|---|---|
| 4,308,321 | A | * | 12/1981 | Hodes et al. | 428/612 |
| 5,086,373 | A | * | 2/1992 | Kurabayashi et al. | 361/502 |
| 5,142,451 | A | * | 8/1992 | Kurabayashi et al. | 361/502 |
| 5,616,368 | A | * | 4/1997 | Jin et al. | 427/535 |
| 5,693,238 | A | | 12/1997 | Schmitt et al. | |
| 5,796,211 | A | * | 8/1998 | Graebner et al. | 315/3.5 |
| 5,977,697 | A | * | 11/1999 | Jin et al. | 313/310 |
| 6,736,147 | B2 | * | 5/2004 | Satoh et al. | 134/1.1 |
| 6,768,574 | B2 | * | 7/2004 | Bertran Serra et al. | 359/265 |
| 7,005,752 | B2 | * | 2/2006 | Bojkov et al. | 257/786 |
| 7,169,327 | B2 | * | 1/2007 | Ito et al. | 252/500 |
| 7,262,126 | B2 | * | 8/2007 | Bojkov et al. | 438/618 |
| 2008/0099923 | A1 | | 5/2008 | Kumar et al. | |
| 2009/0160060 | A1 | | 6/2009 | Hong | |
| 2010/0304045 | A1 | | 12/2010 | Bisges | |

FOREIGN PATENT DOCUMENTS

DE 102007043291 A1 4/2009
JP 5320885 A 12/1993

OTHER PUBLICATIONS

Dr. E. Theophile, Dr. T. Wenger (Reinhausen Plasma GmbH) Industrielle Schichtabscheidung direktaus dem kaltaktiven Plasmastrahl Workshop Schichten aus Nanopartikeln—Abscheidung aus Dispersionen, Flammen und Plasmen Sep. 29, 2009; Dresden; e.theophile@reinhausen-plasma.com; pp. 1-11.
D. Edelstein et al. Full Copper Wiring in a Sub-0,25 µm CMOS ULSI Technology Technical Digest; IEEE International Electron Devices Meeting; 1997; pp. 773-776.
P. C: Andricacos et al. Damascene copper electroplating for chip interconnections IBM J. Res. & Dev.; vol. 42; No. 5; Sep. 5, 1998; pp. 567-574.
English abstract of JP 5320885 A.

* cited by examiner

*Primary Examiner* — Chris Chu

(57) ABSTRACT

According to various embodiments, a method for processing a semiconductor wafer or die is provided including supplying particles to a plasma such that the particles are activated by the plasma and spraying the activated particles on the semiconductor wafer or die to generate a particle layer on the semiconductor wafer or die.

19 Claims, 18 Drawing Sheets

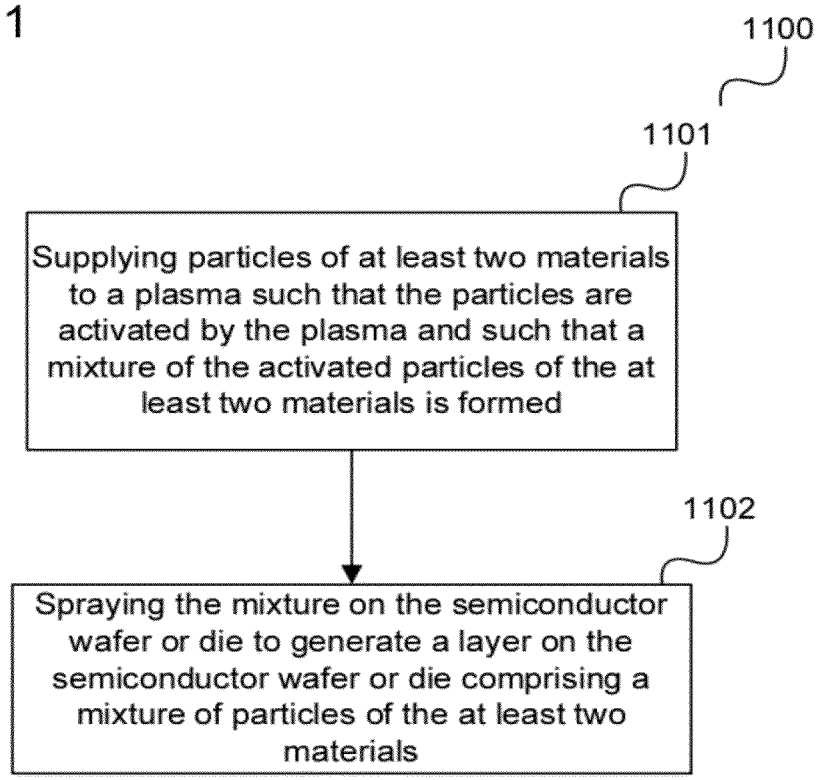

METHOD FOR PROCESSING A SEMICONDUCTOR WAFER OR DIE, AND PARTICLE DEPOSITION DEVICE

TECHNICAL FIELD

Embodiments generally relate to a method for processing a semiconductor wafer or die, a semiconductor wafer or die, and a particle deposition device.

BACKGROUND

In the fabrication of semiconductor chips, processing is typically carried out that involves deposition of a particle layer on existing layers. This may include metallization layers for interconnection or bonding but also the deposition of materials for soldering etc. Efficient methods for particle deposition and patterning of deposited particle layers are desirable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 11 shows a flow diagram according to an embodiment.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Plasma Deposition

According to various embodiments, a plasma deposition method may be used for depositing particles on, e.g. a semiconductor wafer or die. In such a method used according to various embodiments, particles (i.e. the particles to be deposited) are supplied to a plasma such that the particles are activated by the plasma and the activated particles are sprayed on the surface on which the particles are to be deposited, e.g. the surface of a semiconductor wafer or die.

In various embodiments, a plasma jet deposition method is used as plasma deposition method. This means that according to various embodiments, a plasma jet is used for depositing particles on, e.g., a semiconductor wafer or die.

A plasma jet may be understood to be a plasma flow or plasma stream having the form of a jet or a beam which for example extends from the device generating the plasma jet. The generation of the plasma in the form of a jet may be carried out using a dielectric barrier discharge or an arc discharge.

An example of a particle deposition device in which particles (i.e. the particles to be deposited) are supplied to a plasma such that the particles are activated by the plasma and the activated particles are sprayed on the surface on which the particles are to be deposited is described in the following with reference to FIG. 1.

Figure 1:
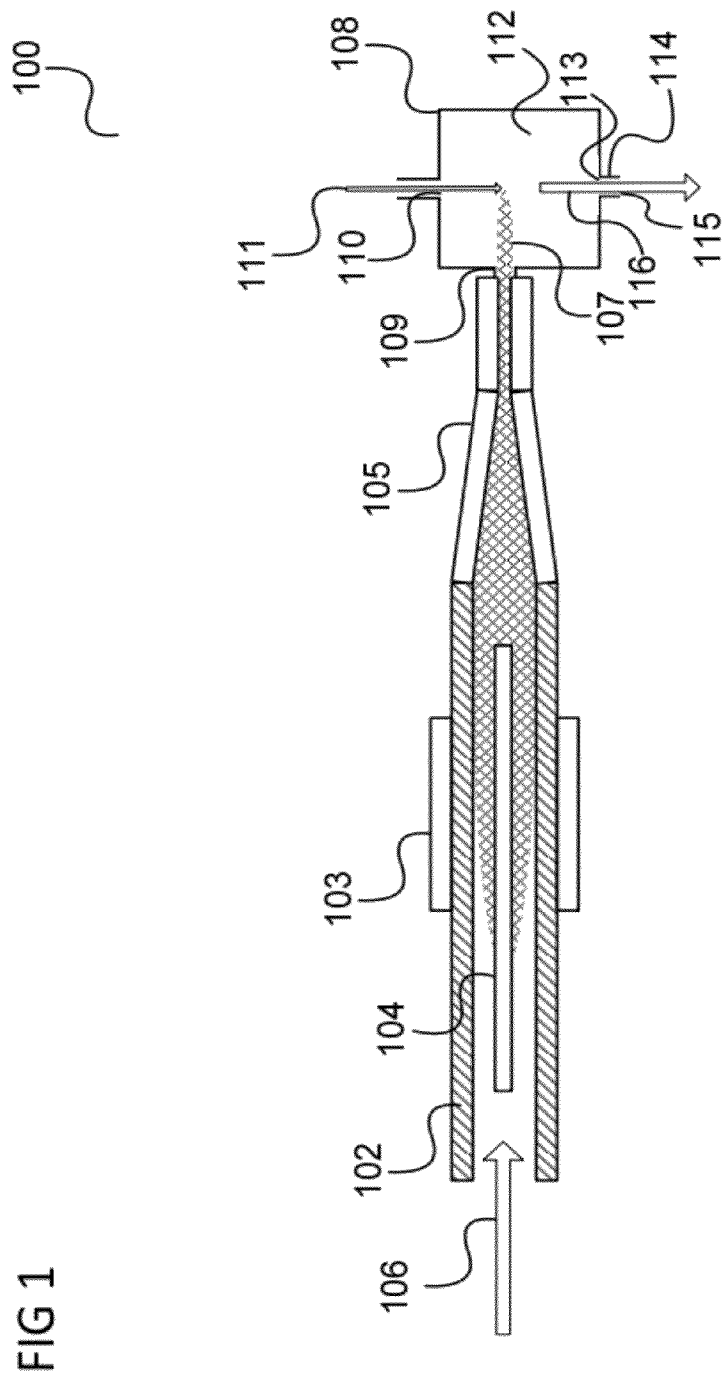
FIG. 1 shows a particle deposition device.

FIG. 1 shows a particle deposition device 100, e.g. for processing or coating a surface.

The particle deposition device 100 of this example is based on the generation of a plasma jet using dielectric barrier discharge. For this, a voltage is supplied to electrodes separated by a dielectric material. In this case, the dielectric material is an isolation pipe wherein one electrode is provided within the pipe and another electrode is provided outside the pipe.

In operation, a glow discharge results. By supplying a processing gas which streams through the device (specifically the tube) a plasma jet is generated. This plasma jet is mixed with a carrier gas (e.g. isolated from the surrounding air). The carrier gas may serve for the processing of a surface or may include the particles used for coating the surface, i.e. the particles to be deposited on the surface.

In various embodiments, the mixing is carried out in a reaction zone outside of the part of the device generating the plasma jet. In the reaction zone energy of the plasma is transferred to the carrier gas and/or the particles included in the carrier gas. For example, the particles included in the carrier gas may be activated by the mixing of the carrier gas with the plasma jet in the reaction zone such that, for example, a stream or jet of (activated) particles is generated.

According to various embodiments, a plurality of reaction zones are provided and different carrier gases are supplied to the reaction zones. Alternatively, the same carrier gas may be supplied to the reaction zones. By supplying different carrier gases to the reaction zones, e.g. supplying carrier gases containing different particles a mixture with different activated gases and/or particles may be generated.

The activated carrier gas or the particle stream, respectively, may be used for processing or coating a surface.

The particle deposition device 100 includes a dielectric barrier, in this example an isolation tube 102. An outer electrode 103 is provided concentrically around the isolation tube 102. In the center of the isolation tube 102 an inner electrode 104 is provided. At one end, the isolation tube 102 is terminated by a plasma head 105. At the other end of the isolation tube 102, a process gas 106 is supplied to the isolation tube. In operation, a plasma jet 107 is generated as a result of a discharge caused by the electrodes 103, 104, which exits the isolation tube through an aperture of the plasma head 105.

The device 101 further includes a reaction chamber 108 including a first inlet 109 for the plasma jet 107. The junction between the first inlet 109 and the aperture of the plasma head 105 may be sealed such that no surrounding air may enter the reaction chamber 108 in this way. The reaction chamber 108 includes a second inlet 110 via which a carrier gas 111 is supplied to an interior space 112 of the reaction chamber 108. Further, the reaction chamber 108 includes an outlet 113. The plasma jet 107 extends via the first inlet 109 into the interior space 112 where the plasma jet 107 and the carrier gas 111 are mixed resulting in an activated carrier gas 114.

The activated carrier gas 116 (in other words, the mixture or the result of the mixing of the plasma jet 107 and the carrier gas 111) exits the reaction chamber 108 via an outlet 113 of the reaction chamber 108, or, in other words, is emitted by the reaction chamber 108 via the outlet 113, flows along a conducting channel 114 and exits the device 101 via an aperture (e.g. a nozzle or orifice) 115. Thus, one end of the conducting channel 114 may be seen to be formed by the outlet 113 while the other end of the conducting channel 114 may be seen to be formed by the aperture 115.

A particle deposition device may also allow the deposition of a mixture of particles of different materials by injecting them from two inlets. This is illustrated in FIG. 2.

Figure 2:
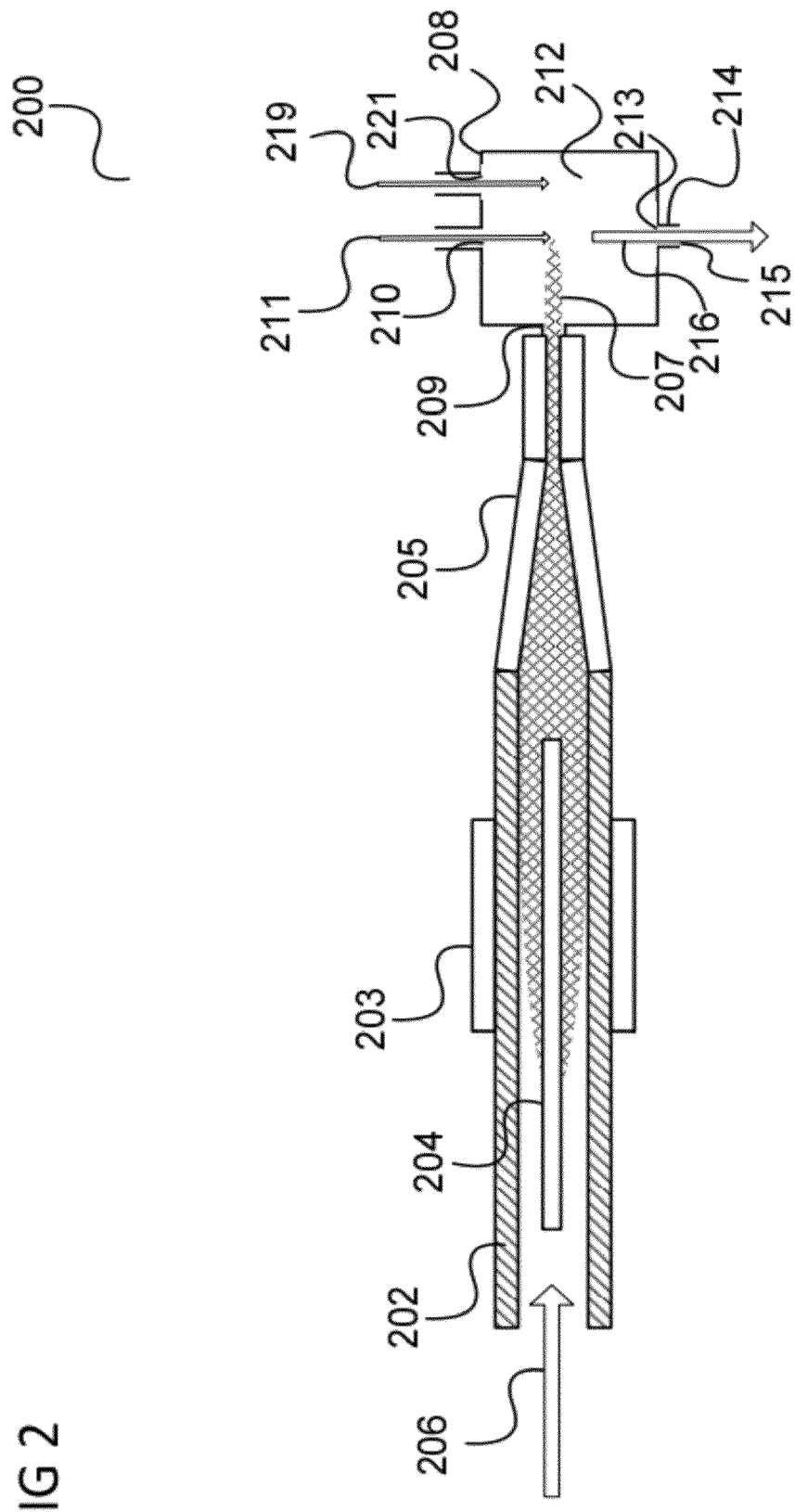
FIG. 2 shows a particle deposition device.

FIG. 2 shows a particle deposition device 200.

Analogously to the particle deposition device 100 described with reference to FIG. 1, the particle deposition device 200 includes an isolation tube 202 to which a process gas 206 is supplied, an outer electrode 203, an inner electrode 204, a plasma head 205 via which a generated plasma jet 207 exits the isolation tube 202, a reaction chamber 208 including a first inlet 209 for the plasma jet 207, a second inlet 210 via which a carrier gas 211 is supplied to an interior space 212 of the reaction chamber 208 and an outlet 213. A further carrier gas 219 is supplied to the reaction chamber 208 via a third inlet 221.

The result of the mixing of the plasma jet 207, the carrier gas 211, and the further carrier gas 219 exits the reaction chamber 208 via the outlet 213, flows along a conducting channel 214 and exits the device 201 via an aperture (e.g. a nozzle or orifice) 215. Thus, one end of the conducting channel 214 may be seen to be formed by the outlet 213 while the other end of the conducting channel 214 may be seen to be formed by the aperture 215.

According to various embodiments, for plasma deposition, a cold-active atmospheric pressure device, e.g. a so-called plasma brush device, may be used, e.g. with a structure like the devices 100, 200 described with reference to FIGS. 1 and 2. Accordingly, in various embodiments, the plasma deposition is based on atmospheric plasma and/or on cold-active plasma. In various embodiments, the plasma is created according to the inverter principle with a pulsed arcing discharge instead of an oscillating circuit.

A plasma deposition device according to various embodiments may be a plasma deposition device allowing coating processes with metals, polymers, or semiconductor layers on a wide variety of basic substrates such as paper, cardboard, textiles, ceramics, glass, metal, and polymers.

According to various embodiments, a plasma deposition is used in which the plasma jet and/or the activated carrier gas and/or particle stream are generated using low temperature compared to other processes such as for example plasma/flame spraying and in which the speed of the activated particles is low in comparison to other procedures such as plasma spraying and cold gas spraying.

According to various embodiments, the particles to be deposited may be supplied in powder form to the plasma jet, for example, as described with reference to FIGS. 1 and 2, using a carrier gas.

Plasma Deposition on a Wafer or Die

According to various embodiments, a plasma deposition device, for example as described above, is used for creating a particle layer on a semiconductor layer or die.

This is described in the following with reference to FIG. 3.

Figure 3:
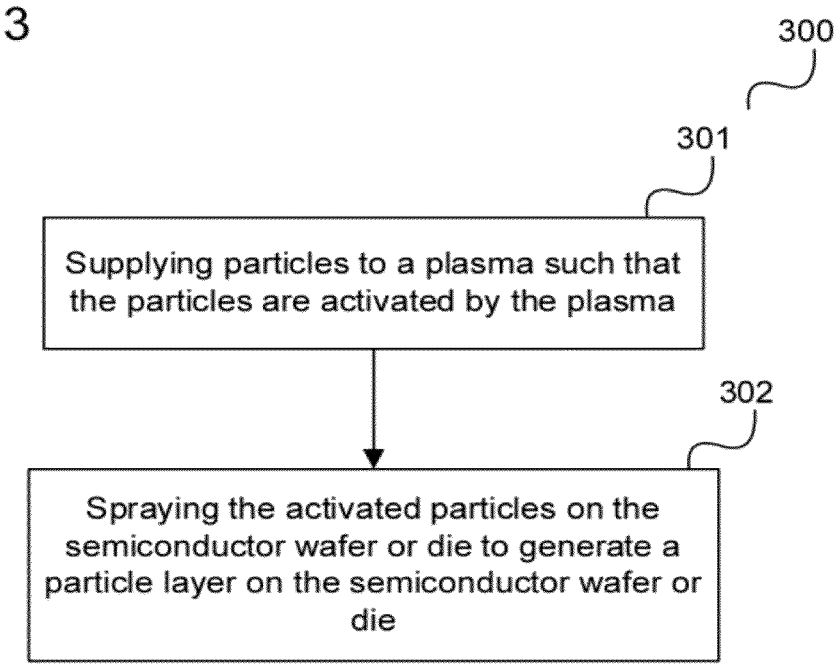
FIG. 3 shows a flow diagram according to an embodiment.

FIG. 3 shows a flow diagram 300 according to an embodiment.

The flow diagram illustrates a method for processing a semiconductor wafer or die.

In 301, particles are supplied to a plasma such that the particles are activated by the plasma.

In 302, the activated particles are sprayed on the semiconductor wafer or die to generate a particle layer on the semiconductor wafer or die.

Illustratively, according to various embodiments, a plasma dust deposition method or a plasma dust deposition is used for depositing material on a semiconductor wafer or die, e.g. in course of a semiconductor chip manufacturing process.

According to various embodiments, the method for processing a semiconductor wafer or die further includes patterning the particle layer.

The particles may for example be supplied to the plasma by means of a carrier gas which may, for example, be supplied at atmospheric pressure.

In various embodiments, the method for processing a semiconductor wafer or die further including generating the plasma.

The plasma is for example generated using a dielectric barrier discharge or an arc discharge. The plasma may for example be generated at atmospheric pressure.

The particles are for example supplied to the plasma in powder form. The particles may be particles of a dielectric material. The particles may also be metal particles. For example, the particles are copper, silver, tin, zinc, rhodium, ruthenium, or tantalum particles.

In various embodiments, the activated particles are sprayed on the semiconductor wafer or die by means of a conducting channel of a particle deposition device, having an end formed by at least one aperture of the particle deposition device, wherein the aperture has the form of an interconnect structure to be deposited on the semiconductor or die.

Plasma Deposition for Reinforcing a Contact Region

According to various embodiments, the particles are sprayed on a layer of the substrate to reinforce the layer of the substrate. Substrate typically refers to a semiconductor wafer, for example silicon, germanium, SiC, GaN, GaAs etc., but can also consist of other materials and have other shapes. Another example for a substrate is a so-called reconstituted wafer, where individual semiconductor chips are embedded in some mold compound matrix (e.g. eWLB=embedded wafer-level ball grid array). For example, particles may be sprayed on a contact pad region, i.e. a contact region, e.g. contact region for a gate, a source, or a drain contact of a field effect transistor, for creating a particle layer reinforcing the layer (e.g. the top layer of the semiconductor wafer in the contact region such as a semiconductor layer forming a gate, source, or drain region or a metallization layer) and for allowing, for example, bonding or soldering on the reinforced layer.

In other words, according to various embodiments, in the method described above with reference to FIG. 3, the activated particles are sprayed on a layer of the semiconductor wafer or die to generate a particle layer reinforcing at least a part of the layer of the semiconductor wafer or die, e.g. to form a reinforced contact region.

In various embodiments, the activated particles are sprayed on a contact region of the semiconductor wafer or die such that the particle layer reinforces the contact region.

For example, the activated are sprayed on a contact region to form a contact pad.

In various embodiments, the activated particles are sprayed on a contact pad of the semiconductor wafer or die such that the particle layer reinforces the contact pad.

According to various embodiments, a semiconductor wafer or die is provided having a porous reinforcement layer, wherein the porosity is between 5%-50%.

The porosity may for example be between 5%-30% or may for example be between 30%-50%.

In various embodiments, the semiconductor wafer includes a contact pad including the porous reinforcement layer.

Illustratively, in various embodiments, the method as described with reference to FIG. 3 may be used for reinforcing a contact region which may be understood to deposit particles on top of the contact region and thus to increase the stability and/or thickness of the layer, or, in other words, to have a resulting contact region (being the arrangement of the original layer plus the deposited particle layer) having an increase stability than the original contact region onto which the particle layer has been deposited.

Direct bonding or soldering on a metal (e.g. copper) surface may lead to adhesion problems at the metal-bond interface. By using plasma deposition as described above with reference to FIG. 3 a think stress-reduced metal layer (e.g. copper) is, in various embodiments, deposited on a silicon wafer for metallization. A thick copper layer may be used for forming a low ohmic (i.e. low resistance) contact pad on the front side or back side of the semiconductor wafer and/or may serve as a head sink for thermal contact.

Direct bonding or soldering on such a copper layer, i.e. a copper layer deposited in this way, is possible due to a relatively high surface roughness (compared to copper layers deposited with other methods). Further, the deposition method described above with reference to FIG. 3 allows surface engineering (plasma treatment) of the semiconductor wafer surface.

With deposition techniques for thick metal films (e.g. copper films) such as physical vapor deposition (PVD) and electrochemical deposition (ECD) metal films may be created providing low ohmic contacts at the cost of high in-film stress values. High film stress may result in high wafer bow which may lead to handling problems and also to high force on underlying layers and thus to cracks. Further, deposition techniques such as chemical vapor deposition (CVD) or physical vapor deposition have a high processing cost, about three times the cost of the plasma deposition method described above with reference to FIG. 3. Therefore, deposition of thick metal films (e.g. of a copper layer with a thickness of 30 μm and above) with these deposition methods (such as CVD and PVD) is typically not possible at low cost. Further, direct bonding on such metal films typically leads to process problems like stability at the bond interface or cracks in underlying layers due to the high bonding force.

The deposition of a particle layer for reinforcing a contact region (e.g. a metallization layer, for example for forming a bonding pad), e.g. by depositing a thick metallic film (such as a copper film) on a contact region of a semiconductor wafer using the method as described with reference to FIG. 3, e.g. with an atmospheric plasma dust deposition method, is described in the following with reference to FIGS. 4 and 5.

Figure 4:
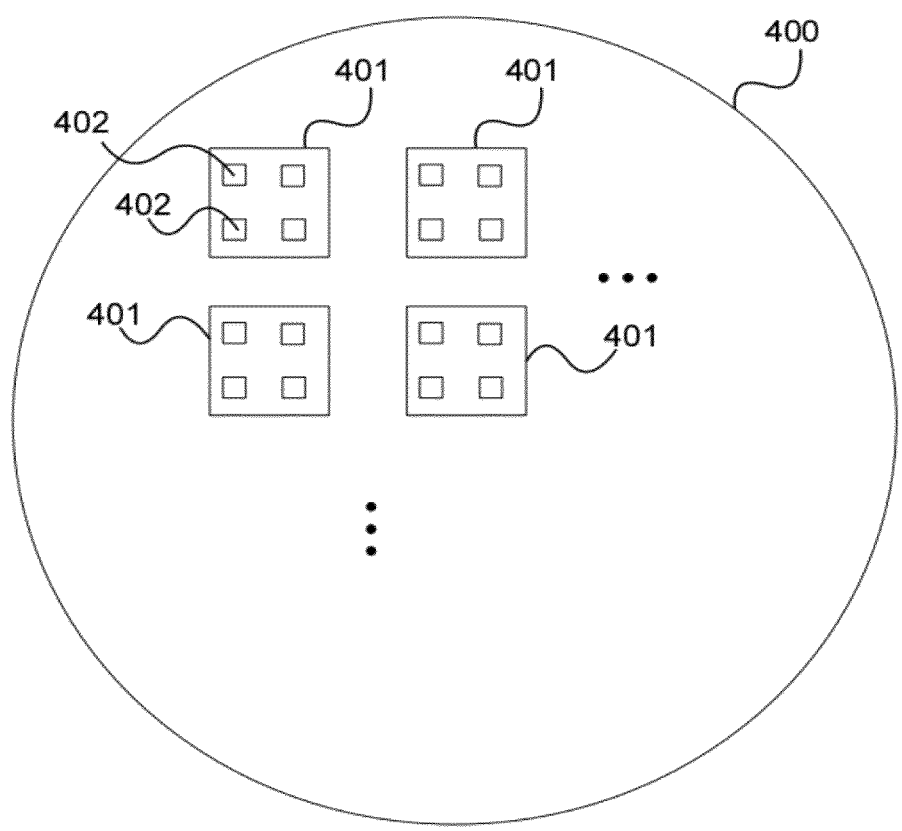
FIG. 4 shows a top view of a wafer according to an embodiment.

FIG. 4 shows a top view of a wafer 400 according to an embodiment.

On the wafer, a plurality of dies 401 are formed, for example using a plurality of patterning, deposition, or removing steps. The dies may have contact regions 402, for example metallization layers that are exposed and that may be used for bonding, e.g. for bonding wires to connect the contact regions 402 to a lead frame for the respective die 402. For allowing a bonding, the contact regions 402 are in various embodiments reinforced by an plasma deposition method as described with reference to FIG. 3.

Figure 5:
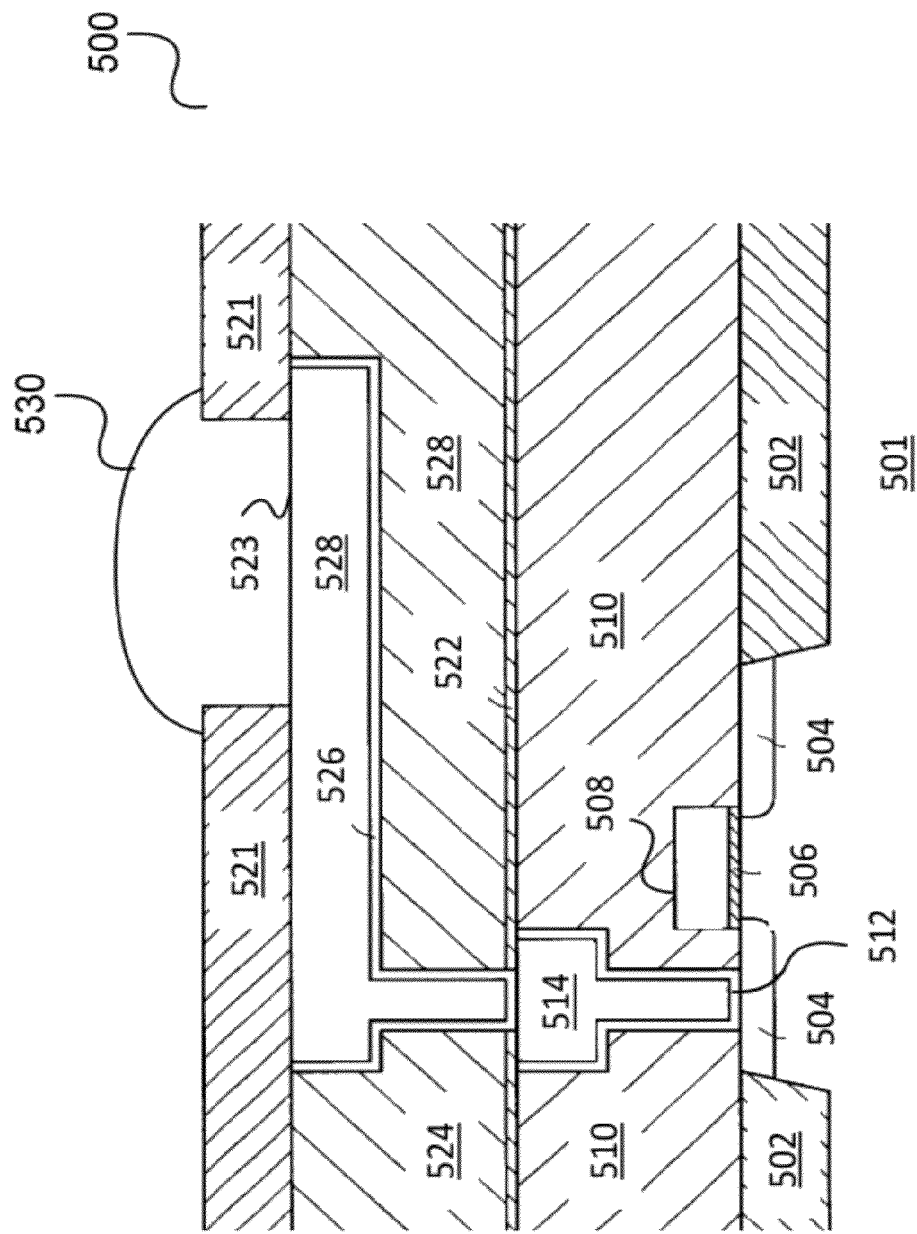
FIG. 5 shows a cross section view of a wafer.

FIG. 5 shows a cross section view of a wafer 500.

The wafer 500 for example corresponds to the wafer 400. Specifically, the cross sectional view of FIG. 5 may correspond to a cross section of a part of one of the dies 401 including one of the contact regions 402.

The wafer 500 includes a substrate 501, field isolation regions 502, and doped regions 504 formed within the substrate 501. A gate dielectric layer 506 overlies portions of the substrate 501 and a gate electrode 508 overlies the gate dielectric layer 506. In other words, in this example, a field effect transistor is formed in what may be seen as the body of the wafer 500.

In various embodiments, the substrate (e.g. a wafer substrate) 501 may be made of semiconductor materials of various types, including silicon, germanium, Group III to V or other types, for example, although in another embodiment of the invention, other suitable materials can also be used. In various embodiments, the substrate 501 is made of silicon (doped or undoped), in an alternative embodiment of the invention, the substrate 501 is part of a silicon on insulator (SOI) wafer. As an alternative, any other suitable semiconductor materials can be used for the substrate 501, for example semiconductor compound material such as gallium arsenide (GaAs), indium phosphide (InP), but also any suitable ternary semiconductor compound material or quaternary semiconductor compound material such as indium gallium arsenide (InGaAs).

According to various embodiments, a plurality of field effect transistors and other elements such as capacitors, diodes, bipolar transistors, inverters etc. may be formed in the wafer 500 analogously to the field effect transistor formed by the doped regions 504, the gate dielectric layer 506, the gate electrode 508 and the substrate 501.

A first interlevel dielectric layer (ILD) 510 is formed over the gate electrode 508 and the semiconductor device substrate 501. The first interlevel dielectric layer 510 is patterned to form dual inlaid openings that are filled with a adhesion/barrier layer 512 and a copper fill material 514. The adhesion/barrier layer 512 may be a refractory metal, a refractory metal nitride, or a combination of refractory metals or their nitrides. The copper fill material 514 may for example be copper or a copper alloy, wherein the copper content is for example at least 90 atomic percent. The copper can be alloyed with magnesium, sulfur, carbon, or the like to improve adhesion, electromigration, or other properties of the interconnect. After depositing the adhesion/barrier layer 512 and the copper fill material 514, the substrate is polished to remove portions of the adhesion/barrier layer 512 and copper fill material 514 outside of the opening.

An insulating barrier layer 522 is formed over the copper filled interconnect and first ILD layer 510. This insulating barrier layer 522 may include silicon nitride, silicon oxynitride or the like. Using an insulating material to form the insulating barrier layer 522 eliminates the need to form additional patterning and etch processes that would otherwise be required to electrically isolate the interconnects from one another if a conductive barrier would be used. A second ILD layer 524 is formed over the insulating barrier layer 522. A dual inlaid interconnect including a conductive adhesion/barrier layer 526 and a copper fill material 528 is formed within the second ILD 524. The dual inlaid interconnect may be formed using processes and materials similar to those used to form the dual inlaid interconnect structure in the first ILD layer 510.

A passivation layer 521 is formed over the second ILD layer 524 and the dual inlaid interconnect. The passivation layer can include one or more films of silicon nitride, silicon oxynitride, silicon dioxide, or the like. Portions of the passivation layer 521 closest to the copper fill material 528 may include silicon nitride or a silicon oxynitride film having a higher concentration of atomic nitrogen relative to atomic oxygen. The passivation layer 521 is patterned to form a bond pad opening 523 that extends through the passivation layer 521 to the copper fill material 528.

The bond pad opening 523 or the part of the copper fill material 528 exposed by the bond pad opening 523 may be seen as a contact region.

The copper fill material 528 or the part of the copper fill material 528 lying above the conductive adhesion/barrier layer 526 may be seen as a metallization layer.

According to various embodiments, a particle layer 530 is formed over the bond pad opening 523 forming a bond pat, i.e. a layer that may be used for bonding the respective die to a lead frame and connecting the contact region formed by the copper fill material 526 exposed by the bond pad opening 523 to the lead frame. The particle layer 530 may be seen to reinforce the metallization layer formed by the copper fill material 526 to allow bonding.

The particle layer 530 is for example a metallic film, e.g. a copper film, deposited with the method as explained above with reference to FIG. 3. A metallic film deposited in accordance with this method allows providing a reinforcement of a layer (e.g. for bonding) with, compared to other methods, reduced film stress (reduction of about 30-50%) at good resistivity (about 1.5-2 times the resistivity of bulk PVD copper), as illustrated in FIG. 6.

Figure 6:
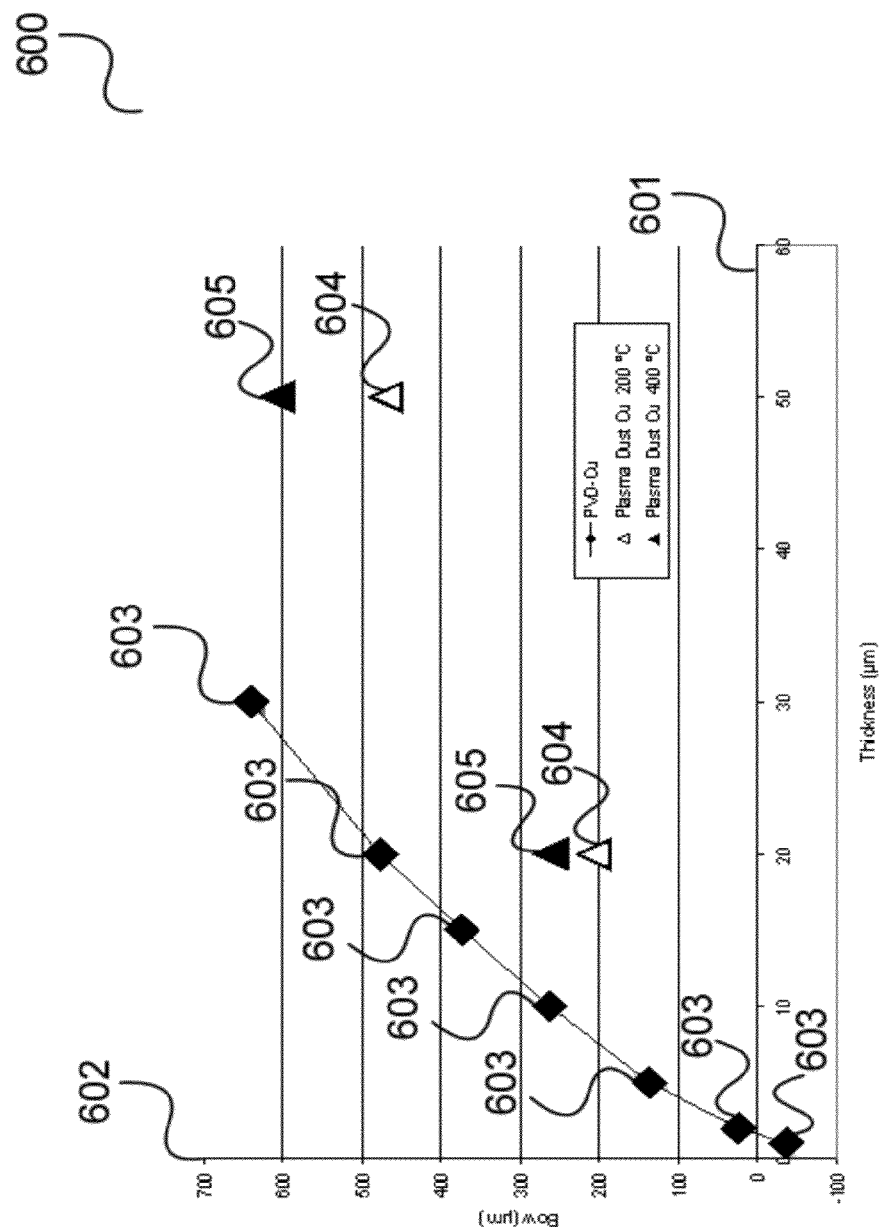
FIG. 6 shows a film stress diagram.

FIG. 6 shows a film stress diagram 600.

In the film stress diagram 600, film thickness increases from left to right along a first axis 601 (thickness is given in µm) and film stress is given in terms of bow (given in µm) increasing from bottom to top along a second axis 602.

First points 603 mark value pairs of thickness and bow of copper deposited using PVD. Second points 604 mark value pairs of thickness and bow of copper deposited using the method as explained above with reference to FIG. 3 at 200° C. and third points 605 mark value pairs of thickness and bow of copper deposited using the method as explained above with reference to FIG. 3 at 400° C.

Figure 7:
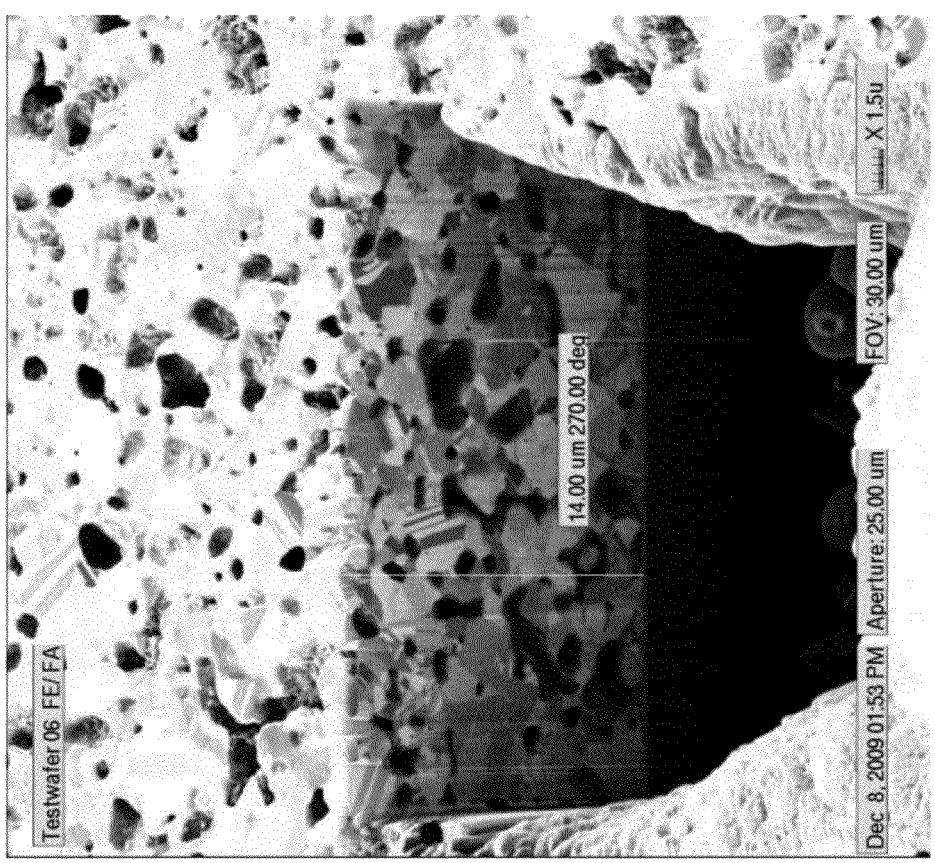
FIG. 7 shows the structure of a metal film deposited using the method as illustrated in FIG. 3.

The lower film stress can be seen to result from the loose, "sponge like" film structure as shown in FIG. 7.

FIG. 7 shows the structure of a metal film deposited using the method as explained above with reference to FIG. 3. Specifically, the metal film is a copper film of 20 µm thickness. One can see the sponge like structure of the metal film. Further, it can be seen that the metal film has a relatively high surface roughness.

The amount of pores in the metal film, i.e. the porosity, e.g. in terms of pore density, i.e. amount of pores per certain volume, may be adjusted in accordance with the needs of the specific application scenario by a corresponding adjustment of the deposition parameters (such as deposition temperature).

For lowering the resistivity, a wafer may be treated by a forming gas at a temperature between 150° C. and 500° C. This is illustrated in FIG. 8.

Figure 8:
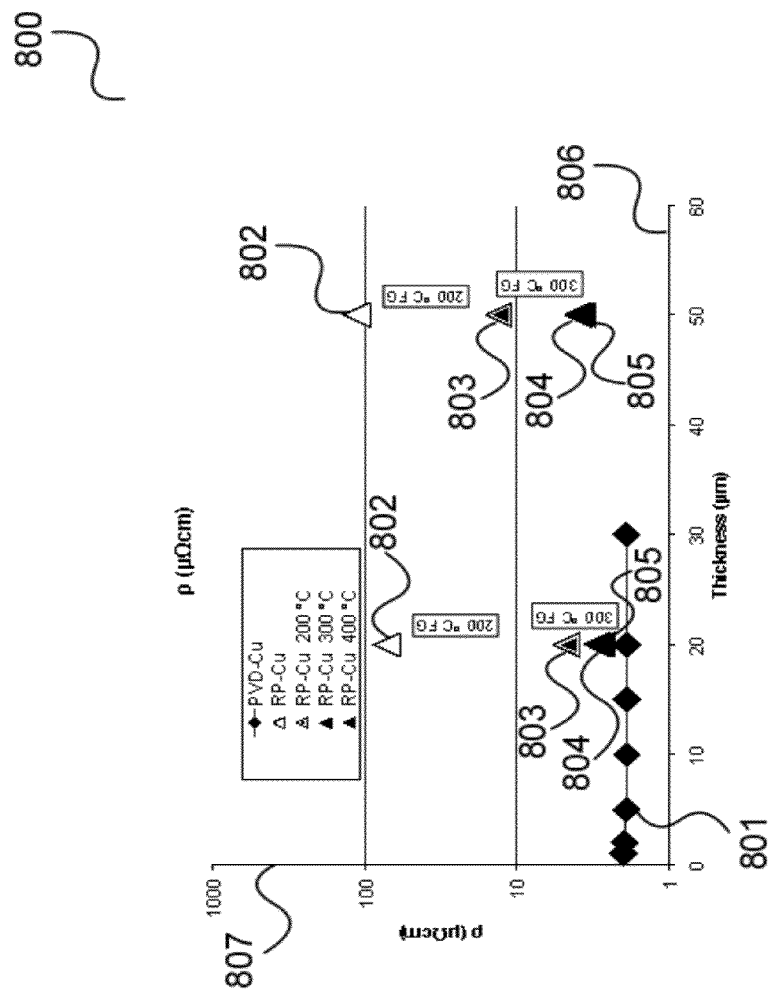
FIG. 8 shows a resistivity diagram.

FIG. 8 shows a resistivity diagram 800.

In the resistivity diagram 800, film thickness increases from left to right along a first axis 806 (thickness is given in µm) and resistivity is given in terms of bow (given in µcm) increasing from bottom to top along a second axis 807.

First points 801 mark value pairs of thickness and resistivity of copper films deposited using PVD.

Second points 802 mark value pairs of thickness and resistivity of copper films deposited using the method described above with reference to FIG. 3, third points 803 mark value pairs of thickness and resistivity of copper films deposited using the method described above with reference to FIG. 3 using a forming gas at 200° C., fourth points 804 mark value pairs of thickness and resistivity of copper films deposited using the method described above with reference to FIG. 3 using a forming gas at 300° C., and fifth points 805 mark value pairs of thickness and resistivity of copper films deposited using the method described above with reference to FIG. 3 using a forming gas at 400° C. Please note that the fourth points 804 and the fifth points 805 are almost identical in FIG. 8. Low resistance may be achieved, too, by using inert gas (e.g. Ar or Xe or forming gas) during deposition itself.

Films of a thickness up to 100 µm can be deposited at acceptable process cost (of about 20% to 30% of the cost of other methods such as PVD or ECD). Thick copper films can provide significant heat capacity and thus improve performance of heat dissipation from semiconductor devices.

Due to the high surface roughness (as illustrated in FIG. 7) and the possibility to treat the surface of the deposited layer after deposition by using, for example, the plasma stream that has been used for deposition, direct bonding and/or soldering on the surface of the particle layer 530 should be possible. This may allow further cost saving.

In addition, the loose sponge structure of the deposited particle layer 530 (as illustrated in FIG. 7) may absorb a part of the bonding force such that increased bonding forces (compared to metal films of similar thickness deposited with other methods) are possible. As a result, the layers under the particle layer 530, such as the layer under the metallization formed by the copper fill material 528, are exposed to reduced stress from the bonding process leading to more product stability and less process problems (such as cracks in IMD layers).

Plasma Deposition for Reinforcing a Wafer

As another example for the purpose of spraying the particles on a layer of the semiconductor wafer to reinforce the layer of the semiconductor wafer using the method as illustrated in FIG. 3, the particle layer may be created to reinforce a thin wafer.

In other words, according to various embodiments, in the method described above with reference to FIG. 3, the activated particles are sprayed on a layer of the semiconductor wafer or die to generate a particle layer reinforcing at least a part of the layer of the semiconductor wafer or die.

In various embodiments, the activated particles are sprayed on a semiconductor wafer or die to cover at least one side of the semiconductor or die completely.

For example, the activated particles are sprayed on a raw semiconductor wafer or die. For example, the activated particles are sprayed on an unpatterned semiconductor wafer or die.

In various embodiments, the semiconductor wafer has a thickness of below 100 µm.

In various embodiments, the method further includes reducing the thickness of the layer of the semiconductor wafer or die after spraying the particle layer onto the layer of the semiconductor wafer or die.

The layer of the semiconductor wafer or die may be a body layer of the semiconductor wafer or die. For example, the layer of the semiconductor wafer or die is a semiconductor body layer of the semiconductor wafer or die.

In various embodiments, the particles are sprayed on a front side, back side, or on both sides of the semiconductor wafer or die.

According to various embodiments, a semiconductor wafer or die is provided having a porous reinforcement layer, wherein the porosity is between 5%-50%.

The porosity may for example be between 5%-30% or may for example be between 30%-50%.

In various embodiments, the porous reinforcement layer covers at least one side of the semiconductor wafer or die completely.

Illustratively, in various embodiments, the method as described with reference to FIG. 3 may be used for reinforcing a wafer which may be understood to deposit particles on top of the wafer and thus to increase the stability and/or thickness of the wafer, or, in other words, to have a resulting wafer (being the arrangement of the original wafer plus the deposited particle layer) having an increase stability than the original wafer onto which the particle layer has been deposited.

Handling of thin wafers becomes more and more important in modern semiconductor device manufacturing. Carrier systems may be used to enable thin wafer handling for further process steps (e.g. backside metallization of thin wafers). A wafer may for example be considered as being "thin" when it has a thickness of less than 100 µm. Carrier systems for processing of thin silicon wafers (e.g. glass carrier wafers) are expensive and often show other drawbacks such as low allowable process temperatures or the requirement for complex process flows. Furthermore, the acceptable minimum silicon thickness is typically limited by the requirements of the handling of the thin wafer.

According to various embodiments, a (for example relatively) thick film is deposited on a (for example relatively) thin wafer using the method as described above with reference to FIG. 3 to stabilize the wafer for further processing.

The deposited film may be a metallic film, for example copper, but may also be formed of other materials such as polymers, plastics, or carbon. The material is for example chosen such that it is stress neutral to the silicon wafer onto which it is deposited and thus leads to minimum wafer bow after deposition.

Because of the low process cost of the method described with reference to FIG. 3 a relatively cheap possibility to allow the handling of thin wafers may be provided according to various embodiments. Furthermore, the fabrication of a the carrier system is not limited by mechanical steps and the silicon thickness is far less limited compared to the usage of carrier systems for thin wafers without reinforcing the wafers. For example, according to various embodiments, very thin silicon wafers (with for example a thickness of several µm) may be processed on (relatively thick) reinforcing layers such as metal (e.g. copper) layers or layers of other reinforcement materials.

Two examples for reinforcing a (thin) wafer using the plasma deposition method described with reference to FIG. 3 are described in the following with reference to FIGS. 9A to 9D (first example) and 10A to 10E (second example).

Figure 9A:
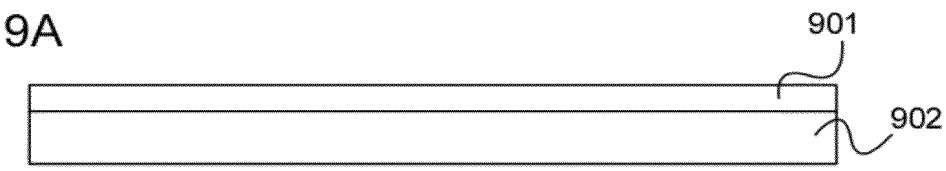
FIGS. 9A to 9D show stages of the wafer reinforcement process.

FIG. 9A shows a first stage of the wafer reinforcement process.

A wafer 901, e.g. a thin silicon wafer is mounted on a mounting frame 902, e.g. a foil.

The wafer 901 for example has a thickness below 100 µm. However, the allowable thickness may depend on the size of the wafer 901. For example, for a bigger wafer has to be above 100 µm and for smaller wafers, the thickness may be below 100 µm.

Figure 9B:
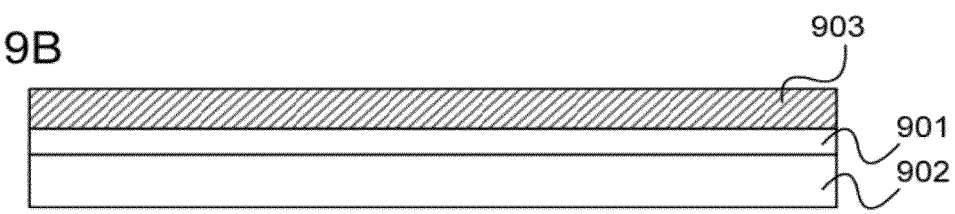

FIG. 9B shows a second stage of the wafer reinforcement process.

In the second stage, a particle layer 903 is deposited on the wafer 901. The particle layer 903 is deposited using the plasma deposition method as described above with reference to FIG. 3. The particle layer 903 may be a metal layer (e.g. of copper) or a layer including other materials such as polymers, carbon, or plastics. The particle layer 902 has a sufficient thickness to sufficiently reinforce the wafer 901. It may thus be seen as a thick layer, e.g. a thick metal layer, of for example up to 100 µm thickness. The particle layer 902 may be deposited in accordance with the plasma deposition method as described above with reference to FIG. 3, using for example a cold process, e.g. with a deposition temperature of below 150° C. directly on the silicon wafer 901. In this example, the silicon wafer 901 is held by the mounting frame 902 (or, alternatively, by a carrier system) on its front side.

Figure 9C:
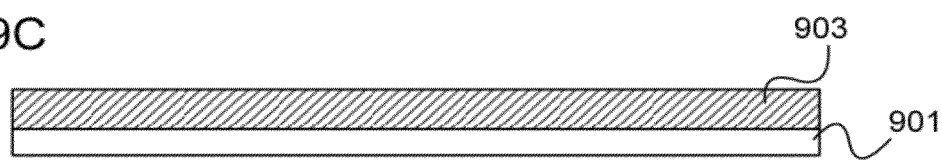

FIG. 9C shows a third stage of the wafer reinforcement process.

In the third stage, the mounting frame 902 is removed. The result can be seen as a reinforced wafer including the original thin wafer 901 and the reinforcing particle layer 903.

Figure 9D:
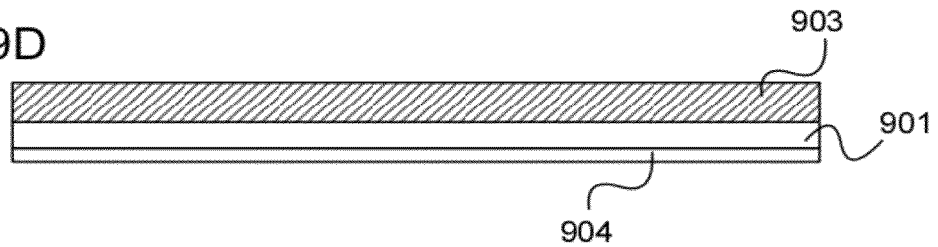

FIG. 9D shows a further processing of the reinforced wafer.

The reinforced wafer may be subjected to further processing. For example, a passivation layer 904 may be formed on a surface of the reinforced wafer corresponding to the original thin wafer 901.

In case that a metal layer such as a copper layer is used as the particle layer 903 that serves as the carrier for the thin wafer 901 the particle layer 903 may be used as a heat sink for the further processing. In addition, the particle layer 903 can be used as a metallic contact for the wafer 901 in this case.

Another example for a wafer reinforcement process is described in the following with reference to FIGS. 10A to 10E.

Figure 10A:
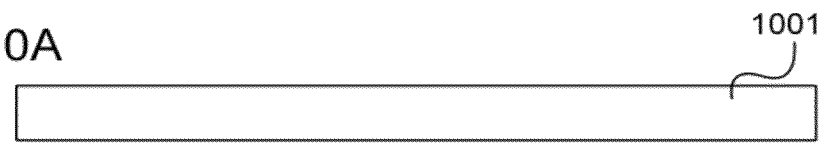
FIGS. 10A to 10E show stages of a wafer reinforcement process.

FIG. 10A shows a first stage of a wafer reinforcement process.

In the first stage, a wafer 1001, e.g. a silicon wafer, is provided. The wafer 1001 may be a "thick" wafer, in other words, the wafer may have a thickness allowing easy processing in terms of the carrier system required. For example, the wafer 1001 has, in the first stage, a thickness of above 100 µm.

Figure 10B:
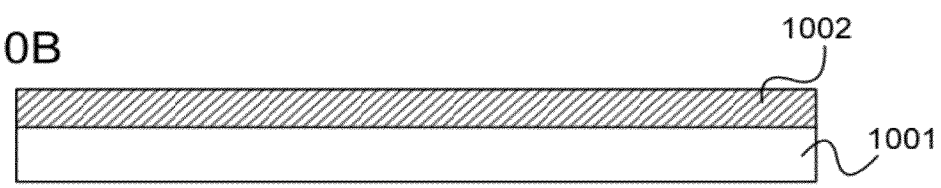

FIG. 10B shows a second stage of a wafer reinforcement process.

In the second stage, a (thick) film of, for example, polymers, plastic, or carbon, is deposited by means of the method described above with reference to FIG. 3, on a front side of the wafer 1001 to generate a reinforcing particle layer 1002.

Figure 10C:
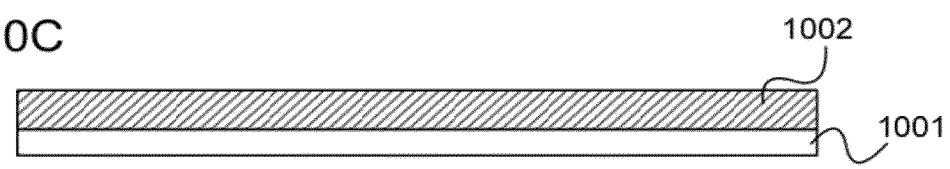

FIG. 10C shows a third stage of a wafer reinforcement process.

The backside of the wafer 1001 is grinded such that the wafer 1001 has the desired thickness, e.g. less than 150 µm or less than 100 µm. Mechanical stability is given to the grinded wafer 1001 by means of the particle layer 1002 serving as reinforcement.

Figure 10D:
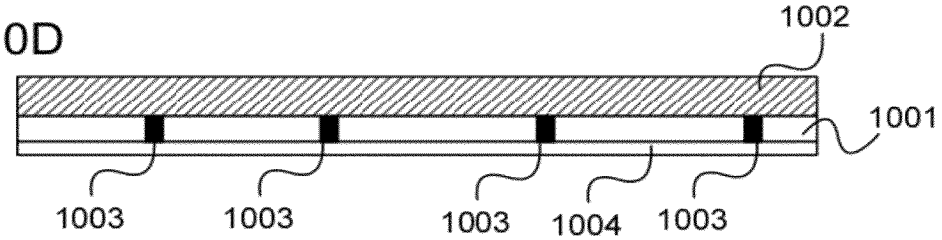

FIG. 10D shows a fourth stage of a wafer reinforcement process.

The fourth stage corresponds to a further processing of the reinforced and grinded wafer 1001. For example, the wafer 1001 may be patterned as indicated by structures 1003, e.g. to separate various elements formed in the body of the wafer 1001 and a metallization layer 1004 may be formed on the wafer 1001.

Figure 10E:
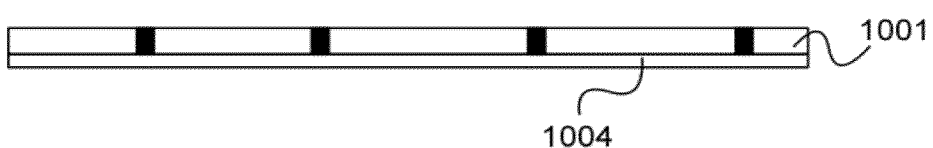

FIG. 10E shows a fifth stage of a wafer reinforcement process.

After the desired processing such as patterning (e.g. for separation) and metallization, the particle layer 1002 is removed.

The desired mechanical properties of the particle layer 1002 (e.g. stress neutrality with respect to the under-lying wafer 1001) can be achieved by the choice a suitable material and suitable deposition conditions (e.g. by adjusting the porosity of the particle layer 1002).

The structure of the particle layer 903, 1002 (and thus the thermal and/or mechanical properties) can be adjusted by variation of the processing parameters. The porosity of the film can be adjusted in the range of, for example 5% to 30% according to the production needs.

Plasma Deposition for Depositing Mixtures

According to various embodiments, the plasma deposition method described with reference to FIG. 3 may be used to deposit a mixture of two materials onto a semiconductor wafer or die. This is illustrated in FIG. 11.

FIG. 11 shows a flow diagram 1100 according to an embodiment.

The flow diagram 1100 illustrates a method for processing a semiconductor wafer or die.

In 1101, particles of at least two materials are supplied to a plasma such that the particles are activated by the plasma and such that a mixture of the activated particles of the at least two materials is formed.

In 1102, the mixture is sprayed on the semiconductor die to generate a layer on the semiconductor wafer including a mixture of particles of the at least two materials.

Illustratively, in other words, a plasma dust deposition method or a plasma dust deposition device is used for depositing a particle mixture, e.g. a mixture of two or more materials, for example a mixture of metals for soldering.

In other words, in various embodiments, the materials are soldering materials which for example form (i.e. the mixture forms) a soldering material.

The materials are for example different materials, e.g. different elements.

In various embodiments, the materials are different metals. For example, the two materials are each one of copper, silver, tin, and zinc.

In various embodiments, the method further includes attaching the semiconductor wafer or die to a lead frame by means of the layer.

In various embodiments, the mixture is sprayed onto a semiconductor die and the method further includes attaching the semiconductor wafer to another semiconductor die by means of the layer.

In various embodiments, the mixture is sprayed on a plurality of semiconductor dies of a semiconductor wafer and the method further includes separating the semiconductor dies after the spraying of the mixture on the plurality of semiconductor dies.

In various embodiments, particles of at three or more materials are supplied to the plasma such that the particles are activated by the plasma and such that a mixture of the activated particles of the three or more materials is formed and wherein the mixture is sprayed on the semiconductor wafer or die to generate a layer including a mixture of particles of the at three or more materials.

The layer may be a porous layer, wherein the porosity is for example between 5%-30%.

In various embodiments, the mixture is sprayed on a back side of the semiconductor wafer or die.

The particles of the two materials are for example activated simultaneously. The particles of the two materials may for example be activated together.

In various embodiments, the particles of the two materials are activated after mixing the particles of the two materials.

The method illustrated in FIG. 11 may for example be used for bringing a mixture of solder materials (also referred to as a solder system) onto a semiconductor wafer or die.

Bringing a solder system onto a semiconductor die for bonding the semiconductor die (i.e. for die bonding) to a lead frame may be difficult but may have advantages with respect to the method for wafer bonding including bringing the solder system onto the lead frame. One of the advantages may for example be a lower consumption of solder materials, since the solder materials may be brought exactly to the place where they are needed for connecting the semiconductor wafer to the lead frame. Furthermore, a lower thickness of the solder layer may be achieved and a swimming of the chip on solder material of a lead frame may be avoided.

Solder materials may be brought onto the backside of a wafer or die using diffusion soldering materials. A diffusion soldering material can be brought onto a die galvanically in alloy or metal form or using sputtering (i.e. sputter deposition). In this case, the reaction rate of the solder is typically limited by the diffusion between the layers of the materials participating in the soldering process. Since diffusion is a relatively slow process, diffusion soldering typically requires more time than a normal soldering process. For increasing the reaction rate, very thin layers may be used. This, however, may give rise to problems in case that the die surface (e.g. the backside of the die) used for bonding the die to the lead frame has an increased roughness. Furthermore, for galvanic deposition or sputtering the usable systems of materials are typically limited. Additionally, the process and the process control is typically complex and risky. It has further to be taken into account that in a subsequent sawing process, the solder layer or solder layers are also sawed. This may result in additional requirements.

According to various embodiments, the method described above with reference to FIG. 11 is used for bringing a mixture of soldering materials on a die, for example for bonding the die to a lead frame. This allows high flexibility (e.g. compared to the usage of galvanic deposition, sputtering and diffusion bonding) regarding the materials used for the soldering. Thus, soldering systems (i.e. mixtures of soldering materials) may be used for soldering which could not be used using, for example, galvanic deposition, sputtering and diffusion bonding, such as CuSn or CuSnAg. Furthermore, the deposition temperature can be reduced to 100° C. and less such that mixtures of particles with a wide variety of sizes can be applied without flux material and without an (unwanted) reaction. The soldering may additionally be carried out at low cost.

Furthermore, using the method described with reference to FIG. 11 for depositing soldering systems leads to a large contact area between the participating materials which leads to a high diffusion rate and thus to a high reaction rate and low reaction time.

Additionally, only a small amount of soldering materials is squeezed beyond the edge of the die (or chip). Furthermore, a high variety of thicknesses of the soldering layers may be provided.

In various embodiments, a die may include a plurality of dies, which may be stacked one above the other. Thus, in various embodiments, a die may include a multi-die-arrangement (in other words, multi-chip arrangement), wherein the die-to-leadframe bonding and a die-to-die bonding may be carried out using the method as described with reference to FIG. 11. In the following, an example for a die is given to which the soldering method based on the plasma deposition method as described with reference to FIG. 11 may be applied.

Figure 12:
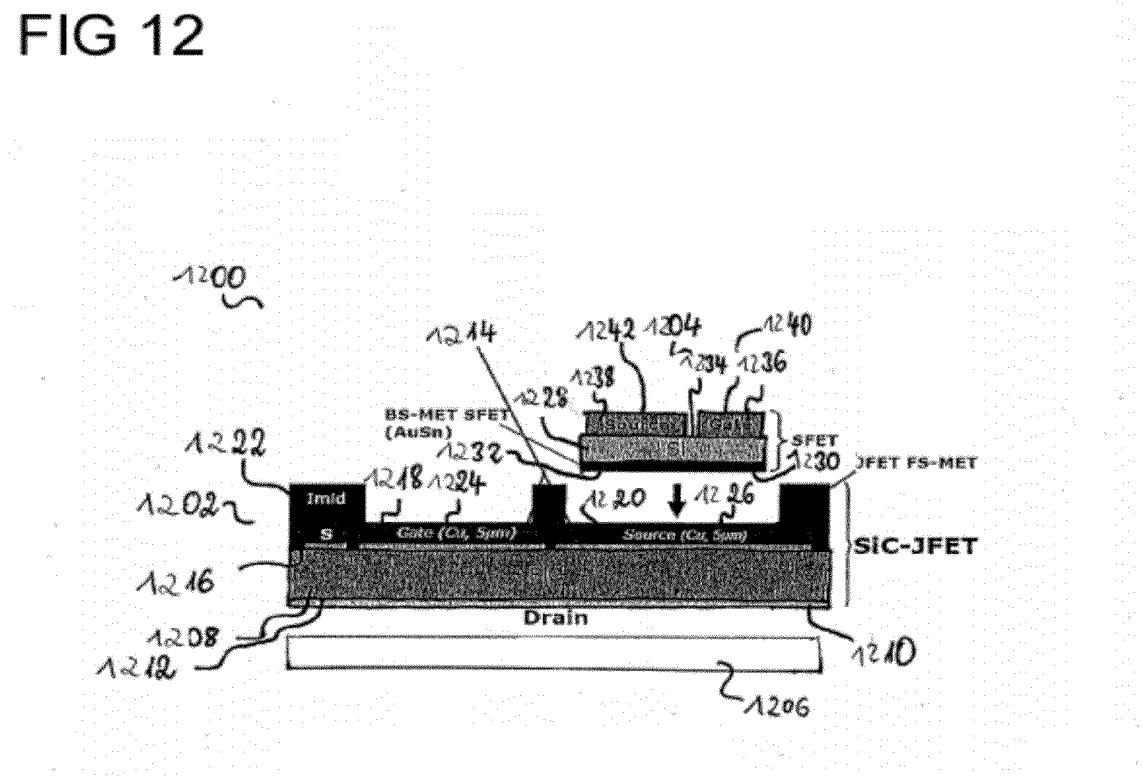
FIG. 12 shows a cross section of a die in accordance with an embodiment.

FIG. 12 shows a cross section of a die 1200 in accordance with an embodiment.

As shown in FIG. 12, in this example, the die 1200 includes a plurality of dies being stacked one above the other. In general, an arbitrary number of dies may be stacked one above the other. The die 1200 of FIG. 12 may include a first power semiconductor die 1202 (e.g. implemented as an SiC-JFET (junction field effect transistor) die 1202), and a second power semiconductor die 1204 (e.g. implemented as a JFET die 1204).

As shown in FIG. 12, the first power semiconductor die 1202 (e.g. implemented as an SiC-JFET die 1202) may include an SiC substrate 1208 and a drain metallization layer 1210 forming a drain region of the SiC-JFET die 1202 (as an implementation of the die bonding region), e.g. made of AuSn. The drain metallization layer 1210 may be located on a first side 1212 (e.g. the backside 1212) of the SiC substrate 1208. The SiC-JFET die 1202 may further include a gate region 1218 and a source region 1220 disposed on or above a titanium diffustion barrier layer 1214 (e.g. having a layer thickness in the range from about 100 nm to about 200 nm, e.g. having a layer thickness of about 150 nm) on a second side 1216 (e.g. the front side 1216) of the of the SiC substrate 1208 opposite the first side 1212 of the SiC substrate 1208. The gate region 1218 and the source region 1220 both may include or consist of copper or a copper alloy, as described above, and may have a layer thickness in the range from about 1 μm to about 10 μm, e.g. a layer thickness in the range from about 3 μm to about 8 μm, e.g. a layer thickness of about 5 μm. The first power semiconductor die 1202 may be molded by means of molding material 1222 such as e.g. an imid, wherein portions of the surface 1224 of the gate region 1218 and portions of the surface 1226 of the source region 1220 remain free of molding material, in other words, remain exposed.

The drain metallization layer 1210 may be die bonded to a frame structure 1206 such as e.g. a lead frame structure, i.e. may be die-to-leadframe bonded, using the method described above with reference to FIG. 11.

The second power semiconductor die 1204 may include a silicon substrate 1228, and a drain metallization layer 1230 forming a draining region of the JFET die 1204 (as an implementation of the die bonding region), e.g. made of AuSn or copper or a copper alloy. The drain metallization layer 1230 may be located on a first side 1232 (e.g. the backside 1232) of the silicon substrate 1228. The JFET die 1204 may further include a gate region 1236 and a source region 1238 disposed on or above a titanium diffustion barrier layer (not shown) on a second side 1234 (e.g. the front side 1234) of the of the silicon substrate 1228 opposite the first side 1232 of the silicon substrate 1228. The gate region 1236 and the source region 1238 both may include or consist of copper or a copper alloy, as described above, and may have a layer thickness in the range from about 1 μm to about 10 μm, e.g. a layer thickness in the range from about 3 μm to about 8 μm, e.g. a layer thickness of about 5 μm. The second power semiconductor die 1204 may be molded by means of molding material such as e.g. an imid, wherein portions of the surface 1240 of the gate region 1236 and portions of the surface 1242 of the source region 1238 remain free of molding material, in other words, remain exposed.

The drain metallization layer 1230 of the second power semiconductor die 1204 may be die bonded to the exposed surface 1226 of the copper containing source region 1220 of the first power semiconductor die 1202, i.e. may be die-to-die bonded, using the method described with reference to FIG. 11.

For die-to-die bonding or die-to-leadframe-bonding, for example for bonding the drain metallization layer 1230 of the second power semiconductor die 1204 to the surface 1226 of the copper containing source region 1220 of the first power semiconductor die 1202 and for die-to-leadframe-bonding, for example for bonding the drain metallization layer 1210 to the frame structure 1206, the particles of the soldering materials used for bonding are mixed and brought onto the respective die surface (e.g. the drain metallization layers 1210, 1230) in accordance with the plasma deposition method described with reference to FIG. 11.

Thus, the mixture of the soldering materials is brought onto the die surface to be bonded. According to the plasma deposition method described with reference to FIG. 11, in various embodiments, the particles bind together without reacting strongly with each other, i.e. the diffusion is strongly local and the particles keep their properties. For example, one can bring mixtures of Cu/Sn or Cu/Sn/Zn at desired defined mixing level onto the die. The particles adhere well and the resulting layers have a pore volume of about 5-30%. The concentration ratio of the particles of, for example, two materials may be chosen to correspond to an eutectic or be in the vicinity of an eutectic, thus allowing an increase of the reaction rate.

In various embodiments, the bonding/soldering materials are deposited on one or more dies of a wafer and after the deposition, sawing and chip separation processes are carried out. The separated chips (or dies) include, on their back surface, a soldering mixture with the desired concentrations of the, for example, metallic materials. The chips may then be placed on a heated lead frame (LF) or, as described with reference to FIG. 12, another die such that the solder reacts, typically within a short time of, for example, less than one second, and forms the inter-metallic phase. The inter-metallic phase may for example include a plurality of metallic equilibrium phases. These equilibrium phases may provide increased melting points allowing to provide a temperature-stable soldering, compared to, for example, soldering mixtures that may be re-melted.

Patterning of Plasma Deposited Porous Layers

According to various embodiments, the plasma deposition method as described with reference to FIG. 3 may be used in course of a patterning process, i.e. for the deposition of a particle layer in a process to form a patterned layer.

Figure 13:
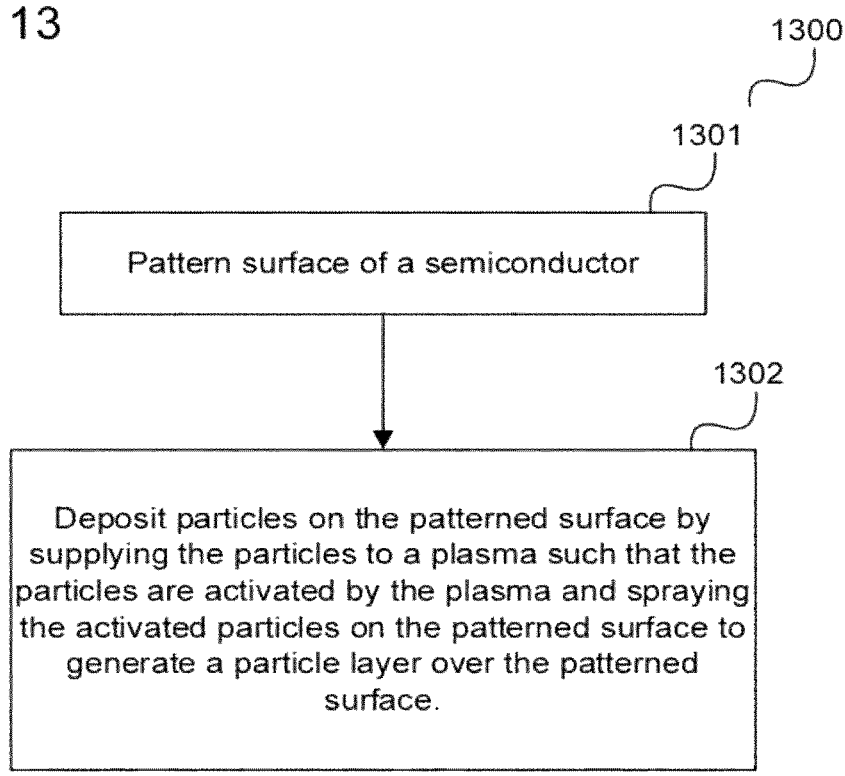
FIG. 13 illustrates a method of processing a semiconductor wafer.

This is illustrated in FIG. 13.

FIG. 13 illustrates a method of processing a semiconductor wafer.

In 1301, a surface of the semiconductor wafer is patterned.

In 1302, particles are deposited on the patterned surface by supplying the particles to a plasma such that the particles are activated by the plasma and the activated particles are sprayed on the patterned surface to generate a particle layer over the patterned surface.

In other words, in various embodiments, the method described with reference to FIG. 3 may further include patterning a surface of the semiconductor wafer or die, wherein the activated particles are sprayed on the semiconductor wafer or die to generate a particle layer on the patterned semiconductor wafer or die.

Illustratively, in various embodiments, a plasma dust deposition method is used for depositing a layer in course of patterning method. For example, a patterning method is used such that the layer deposited using the plasma dust deposition method is patterned In various embodiments, the surface of the semiconductor wafer or die is patterned to include a patterned mask.

In various embodiments, the surface of the semiconductor wafer or die is patterned to include a patterned dielectric mask.

The method may further include patterning the particle layer.

In various embodiments, the semiconductor wafer or die and the particle layer are patterned in accordance with the Damascene or the Dual-Damascene technique.

In various embodiments, the semiconductor wafer or die and the particle layer are patterned in accordance with the Lift-Off technique.

In various embodiments, the particle layer is a metal layer or a dielectric layer.

The method may further include depositing a barrier and/or a seed layer, wherein the particle layer is sprayed on the barrier and/or the seed layer.

According to various embodiments, the method illustrated in FIG. 13 is used in course of a Damascene (or Dual Damascene) process or a Lift-Off process.

Metal layers that are formed using the method described with reference to FIG. 3 may have a high density of pores (e.g. 5% to 30%). Patterning such a layer using methods such as wet chemical etching or plasma etching may therefore lead to poorly defined flanks of the etched structure and undesired etching of parts that are meant to remain on the wafer.

The patterning methods used according to various embodiments allow the usage of particle layers formed using the method described with reference to FIG. 3 for certain applications such as bonding pad reinforcing, thick metal interconnects, and interconnect redistribution by providing a reliable patterning of thick porous metal films (such as copper films resulting from atmospheric plasma deposition) based on, for example CMP (Chemical Mechanical Polishing), Damascene-Technique, and Lift-Off-Technique.

The patterning methods according to various embodiments may also be used for porous dielectric layers, e.g. ceramic and polymer layers.

According to various embodiments, porous conductive paths on a semiconductor wafer are formed using the plasma deposition method as explained with reference to FIG. 3. To avoid short circuits or gaps in the conductive paths a large chip area would need to be used in case that wet etching is used for forming the conductive parts. Both the sizes of the metal paths and the distances between the metal paths would need to be increased compared to the usage of non-porous conductive paths when using wet etching for their formation. This would make the usage of porous conductive paths uninteresting from an economic point of view since the cost advantage that may be achieved by forming porous conductive paths using the plasma deposition method as explained with reference to FIG. 3 would be nullified by the increased chip area requirement.

In various embodiments, the plasma deposition method as explained with reference to FIG. 3 is used for forming a particle layer, e.g. a metal layer, which is patterned using the Damascene technique. The process for forming a patterned metal layer based on the plasma deposition method as explained with reference to FIG. 3 and based on Damascene technique is described in the following with reference to FIGS. 14A to 14E.

Figure 14A:
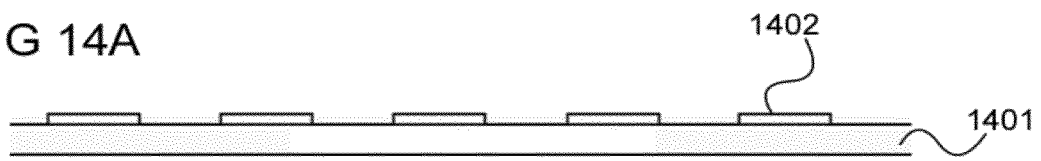
FIGS. 14A to 14E show stages of a patterned metal layer forming process.

FIG. 14A shows a first stage of the patterned metal layer forming process.

A silicon wafer 1401 with metallization pads or metallization lines 1402 is provided.

Figure 14B:
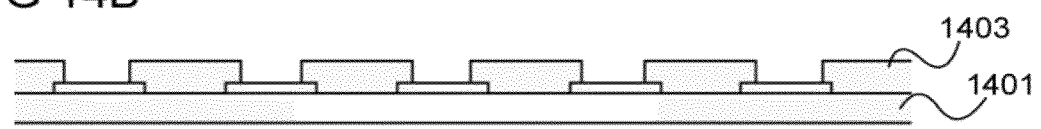

FIG. 14B shows a second stage of the patterned metal layer forming process.

According to the Damascene technique, an intermetal-dielectric (such as silicon oxide, silicon nitride, photo imid, a polymer, or a photo resist) is brought onto the wafer 1401 including the metallization pads 1402 and is patterned.

For example, a polymer layer that can be patterned using lithography is deposited onto the wafer 1401 including the metallization pads 1402 and the polymer mask is patterned (using lithography) to form a polymer mask 1403. The thickness of the polymer mask defines the final thickness of the patterned metal layer that is to be formed. For example, for a final thickness of the patterned metal layer of 5 µm, the thickness of the polymer may be selected to be about 5.5 µm.

Figure 14C:
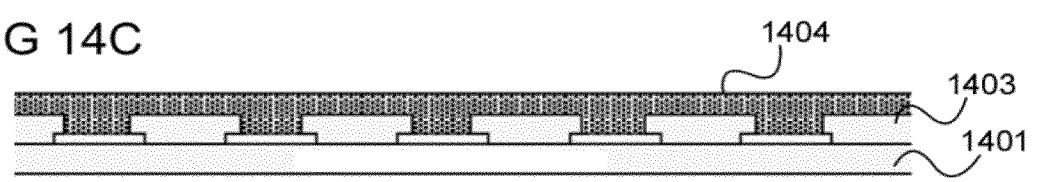

FIG. 14C shows a third stage of the patterned metal layer forming process.

Figure 14D:
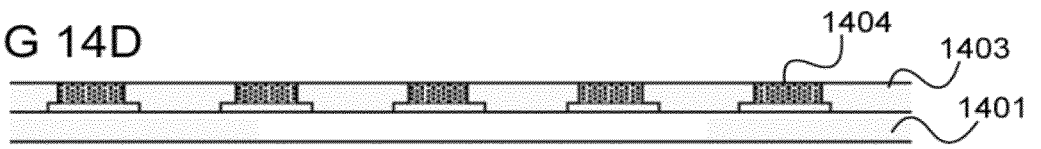

Over the patterned intermetal-dielectric layer, such as the polymer mask 1403, a metal layer (to be patterned) 1404 is deposited using the plasma deposition method described with reference to FIG. 3. The metal is for example copper or tungsten or titanium or tantalum. The metal layer may be deposited all over the wafer 1401 (or all over a considered part of the wafer, e.g. a wafer area corresponding to one or more dies). The metal particles are for example blown onto the wafer 1401 at atmospheric pressure. The size of the particles is for example chosen such that it is smaller than about one third of the size of the structures onto which the metal layer is to be deposited, i.e., in this example, the structure size of the polymer mask 1403, such that the structures are completely filled by the metal layer. FIG. 14D shows a fourth stage of the patterned metal layer forming process.

Following the plasma deposition, the (porous) metal layer 1404 is polished to the height of the intermetal dielectric, e.g. the polymer mask 1403, such that the intermetal dielectric is exposed and the metal layer surface is flattened. It should be noted that the minimum structure size of the patterning of the metal layer 1404 at the end of the process is given by the patterning of the interdielectric, e.g. the polymer mask 1403. The polishing is for example a chemical mechanical polishing (CMP). The parts of the metal layer 1404 which are located in the trenches formed by the polymer mask 1403 remain after the polishing.

Figure 14E:
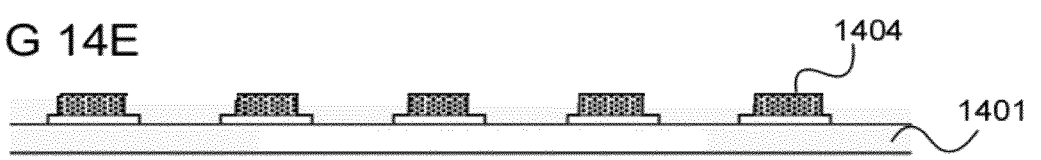

FIG. 14E shows a fifth stage of the patterned metal layer forming process.

Following the polishing, the intermetal dielectric, e.g. the polymer mask 1403, is removed. Alternatively, it can be kept on the wafer 1401 to serve as isolation between the metal paths of the patterned metal layer 1404.

Using the process described with reference to FIGS. 14A to 14E, one interconnect metallization layer may be formed. Using the polishing, e.g. a CMP polishing, may have the advantage that uncontrolled etching of the porous metal layer can be avoided, as they may occur when using an etching process for patterning the metal layer 1404. A polished copper layer deposited using the plasma deposition method described with reference to FIG. 3 is shown in FIG. 7 described above. No etching of the metal layer is visible in FIG. 7. Due to the porosity of the metal layer, the CMP removal rate is increased compared to a non-porous metal layer such that the CMP process may be used for removing even thick layers cost-effectively.

In various embodiments, the forming of contact paths to lower metal layers (e.g. metal layers buried in the body of the wafer 1401) is carried out analogously to the process described with reference to FIGS. 14A to 14E using Dual-Damascene.

In various embodiments, a barrier and/or a seed layer system is brought onto the wafer 1401 (including the pattern intermetal dielectric) before the deposition of the porous metal layer 1404 for enhancing the contact to buried metal layers, for example by sputtering or using CVD.

As mentioned above, the dielectric between the metal paths of the patterned metal layer 1404 may be removed after the patterning of the metal layer 1404. Thus, the sides of the metal paths are exposed such that a better heat dissipation may be achieved compared to buried metal paths or metal paths enclosed with dielectric at their sides. This may be of advantage for power semiconductor elements.

In various embodiments, an oxide layer or a nitride layer is deposited and patterned instead of the polymer layer 1403. Otherwise, the process may be carried out as described with reference to FIG. 14. The patterned oxide or nitride may remain between the metal paths of the patterned metal layer 1404 to serve as isolation or may be selectively removed after the CMP (while letting the patterned metal layer 1403 remain).

Instead of the metal layer 1404, patterned dielectric layers such as ceramic layers or polymer layers may be formed using the Damascene technique as described above.

In various embodiments, the plasma deposition method as explained with reference to FIG. 3 is used for forming a particle layer, e.g. a metal layer, which is patterned using the Lift-Off technique. The process for forming a patterned metal layer based on the plasma deposition method as explained with reference to FIG. 3 and based on Lift-Off technique is described in the following with reference to FIGS. 15A to 15E.

Figure 15A:
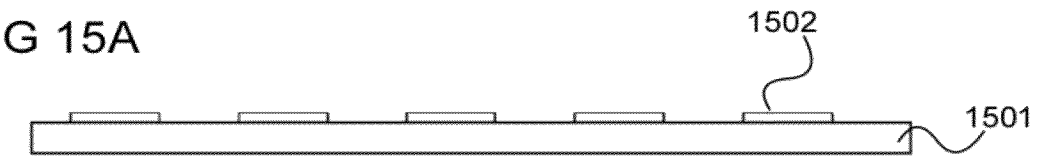
FIGS. 15A to 15E show stages of the patterned metal layer forming process.

FIG. 15A shows a first stage of the patterned metal layer forming process.

A silicon wafer 1501 with metallization pads 1502 is provided.

Figure 15B:
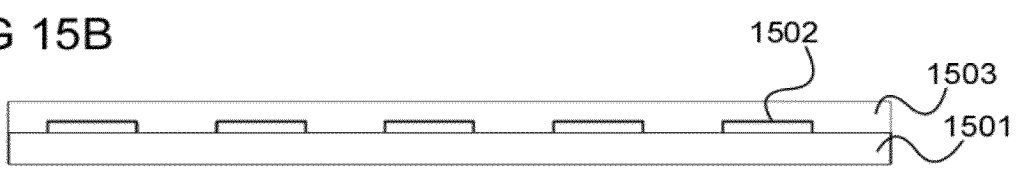

FIG. 15B shows a second stage of the patterned metal layer forming process.

A resist (e.g. a photo resist) 1503 is brought onto the wafer 1501 including the metallization pads 1502, for example using the Spin-On technique.

Figure 15C:
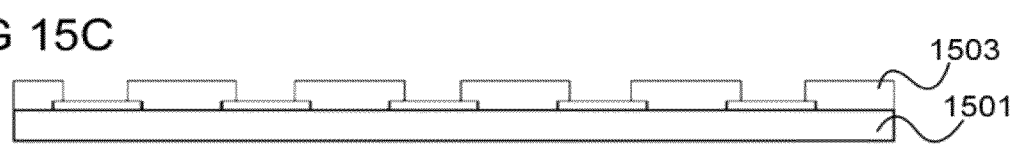

FIG. 15C shows a third stage of the patterned metal layer forming process.

The resist 1503 is patterned such that the resist is removed at those places at which a metallization should be brought into place, for example using lithography.

Figure 15D:
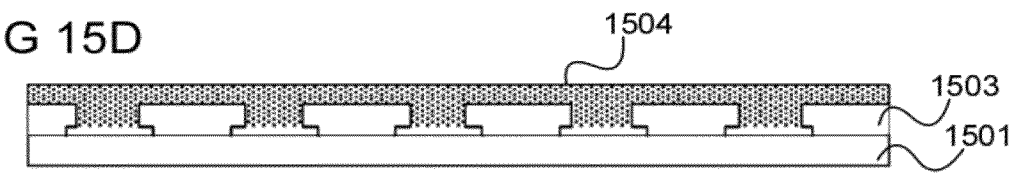

FIG. 15D shows a fourth stage of the patterned metal layer forming process.

Using the plasma deposition method described above with reference to FIG. 3, a metal layer 1504 (e.g. copper or aluminum) is deposited on the wafer 1501, including the patterned resist 1503.

Figure 15E:
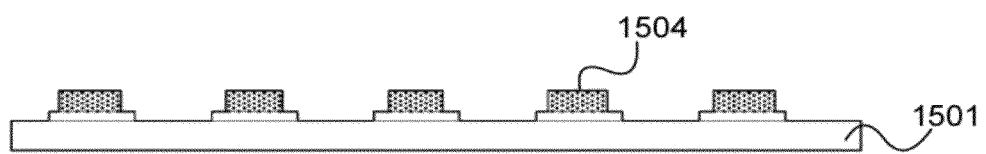

FIG. 15E shows a fifth stage of the patterned metal layer forming process.

The resist is removed, wherein the parts of the metal layer 1504 which are above the parts of the wafer 1501 covered by resist are also removed. The parts of the metal layer 1504 remain at those parts of the surface at the wafer 1501 which are not covered by resist. For removing the resist 1503 (which is, in this example, covered by the metal layer 1504) the porosity of the metal layer 1504 may be exploited, e.g. to bring a fluid for removing the resist 1503 in contact with the resist.

The result of the metal layer forming process is an exposed patterned porous metal layer 1504 as shown in FIG. 15E.

By forming thick patterned metal layers (e.g. of a thickness from 10 μm to 100 μm) using the techniques described above with reference to FIGS. 14A to 14E and FIGS. 15A to 15E, the patterned metal layers may be provided at low cost. Further, the patterning has a high reliability and a high packing density may be achieved. The processing may be carried out at relatively low process temperatures (e.g. a process temperature of below 150° C. may be possible). Further, wafer stress and wafer bow may be kept low by using a porous metal layer. The metal layer may have good heat dissipation capabilities (e.g. by using a thick copper metallization).

In various embodiments, a seed layer is not used such that costs may further be reduced.

Using the plasma deposition method described with reference to FIG. 3, layers may be formed having excellent mechanical, thermal and electrical properties.

Usage of an Aperture with an Interconnect-Adapted Form

According to various embodiments, the plasma deposition method described with reference to FIG. 3 is used to spray interconnect structures, e.g. conductive paths or conductive pads, onto a carrier such as a semiconductor wafer or die or also a printed circuit board, for example for forming electrical interconnections between a chip and the electrical connections of the chip package, e.g. for forming interconnections from the chip itself to a lead frame. For example, metal particles are sprayed onto a carrier using the plasma deposition device described with reference to FIG. 1 or FIG. 2. For this, in various embodiments, the aperture of a plasma deposition device, e.g. the apertures 115, 215 of the plasma deposition devices of FIG. 1 and FIG. 2, e.g., a nozzle and/or an orifice, may be adapted to the interconnect structure to be formed.

Figure 16:
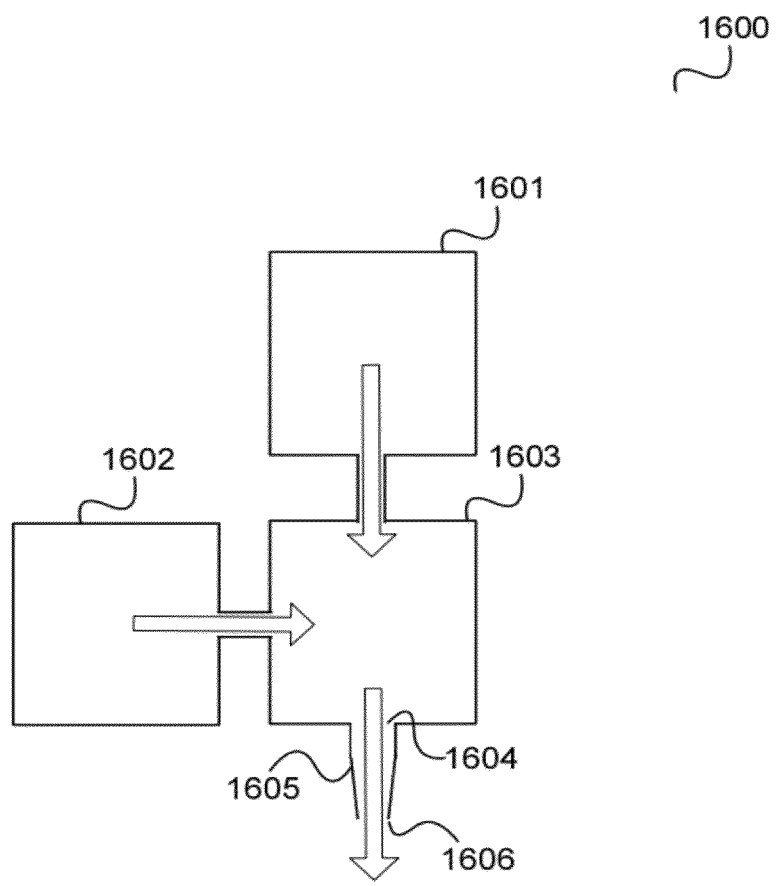
FIG. 16 shows a particle deposition device according to an embodiment.

Accordingly, in various embodiments, a particle deposition device is provided as illustrated in FIG. 16.

FIG. 16 shows a particle deposition device 1600 according to an embodiment.

The particle deposition device 1600 includes a first supplying part 1601 supplying a plasma jet to a reaction chamber 1603, a second supplying part 1602 supplying a carrier gas to the reaction chamber 1603. The particle deposition device 1600 also includes the reaction chamber 1603 for mixing the plasma jet and the carrier gas to generate a mixture, wherein the reaction chamber includes an outlet 1604 to emit the mixture.

The particle deposition device 1600 further includes a conducting channel 1605 having a first end formed by the outlet 1604 and having a second end formed by at least one aperture 1606 of the particle deposition device 1600 having the form of an interconnect structure to be deposited on a carrier.

In other words, the opening of the particle deposition device 1600, which may be seen as a plasma deposition device, e.g. a plasma dust deposition device in various embodiments, by which the particles to be deposited are sprayed on a carrier is adapted to the form of interconnect structures to be formed.

The carrier is for example a semiconductor wafer, a semiconductor die, or a printed circuit board.

According to various embodiments, the aperture includes a plurality of separated openings.

In one embodiment, at least a part of the form the aperture of the aperture corresponds to the form of a metal path. For example, at least a part of the form the aperture of the aperture corresponds to the form of a interconnection line and/or at least a part of the form of the aperture corresponds to the form of a contact pad.

In various embodiments, at least a part of the form of the aperture corresponds to the form of a metal path connected with a contact pad at one end.

At least a part of the form of the aperture may correspond to the form of a metal path connected with contact pads at both ends.

In various embodiments, at least two separated parts of the form of the aperture each correspond to the form of a metal path connected with a contact pad at one end.

In various embodiments, at least two separated parts of the form of the aperture each correspond to the form of a metal path connected with a contact pad at both ends.

The aperture may for example include at least one straight edge. The aperture may include at least two straight edges, for example.

In various embodiments, at least a part of the form of the aperture corresponds to the form of an interconnect structure having a first end and a second end and a middle section being tapered with respect to the first end and the second end.

The carrier gas for example includes copper, silver, tin, zinc, rhodium, ruthenium, or tantalum particles.

Examples for forms of an aperture, e.g. a nozzle, of a particle deposition device corresponding to an interconnect structure are given in FIG. 16. The forms illustrated may be seen as a top view of interconnect structures to be formed on a carrier corresponding to the form of the aperture of the particle deposition device.

Figure 17:
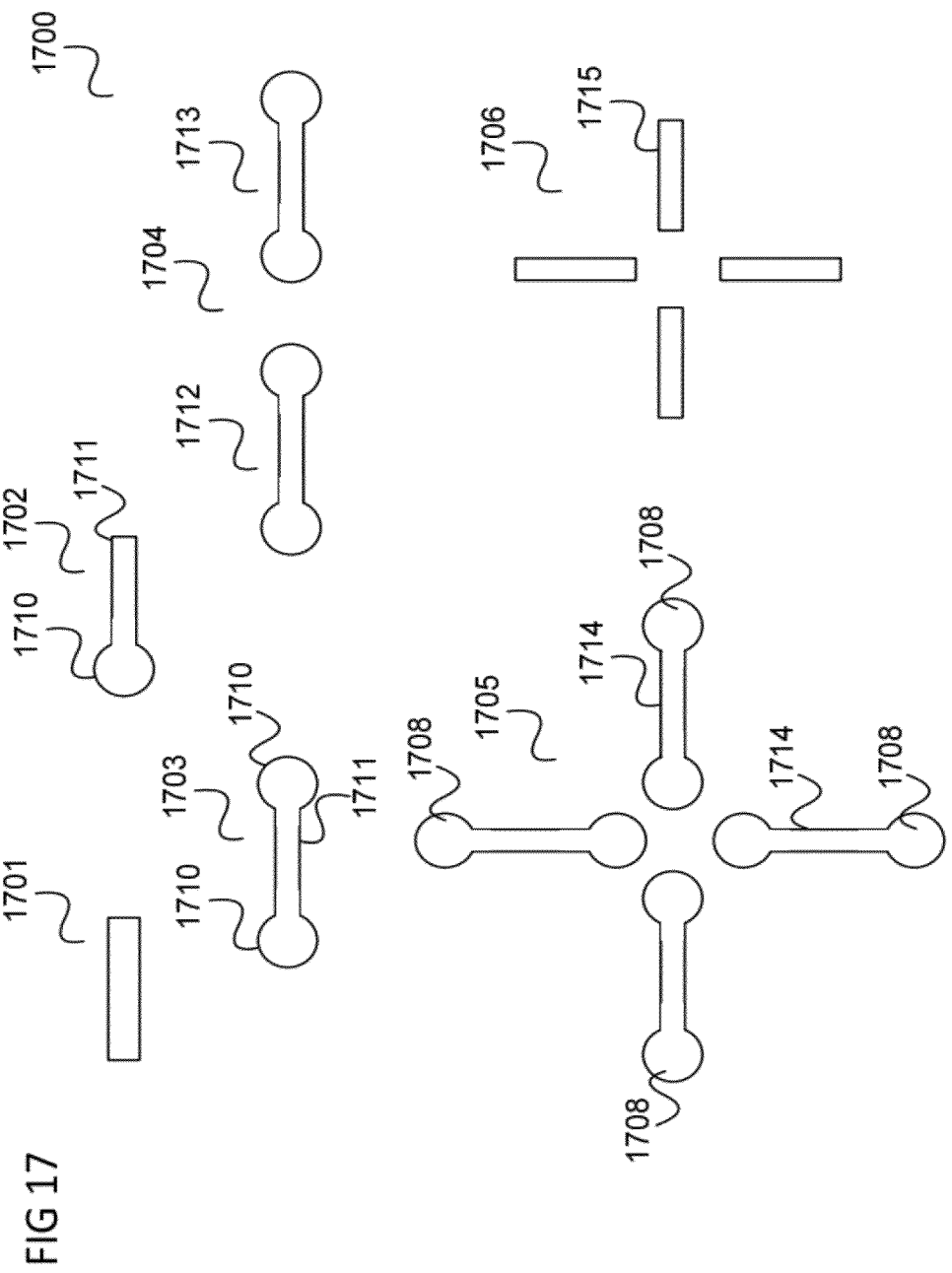
FIG. 17 shows aperture forms according to various embodiments.

FIG. 17 shows aperture forms according to various embodiments.

A first aperture form 1701 can be seen to correspond to a metal path to be formed on a carrier, for example a metal path for connecting to semiconductor devices located on the carrier. Such an aperture form of a metal path may additionally include one or two elements at one or two ends having a form corresponding to a contact pad to be formed on a carrier, as illustrated by a second aperture form 1702 and a third aperture form 1703. Pad elements 1710 of the second aperture form 1702 and the third aperture form 1703 having the form of a contact pad may be seen to be connected by the metal path element 1711 having the form of a metal path. The second aperture form 1702 and the second aperture form 1703 may be used to form an interconnect structure allowing connecting, e.g. via bonding, of a semiconductor device using the pads corresponding to the pad elements.

In various embodiments, as in case of the first aperture form 1701, the second aperture form 1702, and the third aperture form 1703, the aperture may be seen to form one connected shape.

Alternatively, in various embodiments the aperture may include a plurality of separated openings. For example, according to a fourth aperture form 1704, the aperture includes a first opening corresponding to a first element 1712 of the fourth aperture form 1704 and a second opening corresponding to a second element 1713 of the fourth aperture form 1704. The first opening and the second opening are separated from each other, i.e. they are not connected, in other words they do not form a continuous opening.

Such an aperture form may also include more than two separated parts (i.e. separated openings). For example, according to a fifth aperture form 1705, the aperture may have four separated openings corresponding to four elements 1714 of the fifth aperture form 1705. The fifth aperture form 1705 may for example be used for forming an interconnect structure for a semiconductor device having four contacts. These four contacts may be for example bonded to the carrier using the pads corresponding to the inner pad elements 1707 of the fifth aperture form 1705. The outer pad elements 1708 may then be used for connecting other semiconductor elements or, for example, for bonding to a lead frame.

It should be noted that an aperture form corresponding to separated elements such as the fourth aperture from 1704 and the fifth aperture form 1705 does not necessarily have to include pad elements. For example, a sixth aperture form 1706 can be seen to correspond to the fifth aperture form 1705 without the pad elements 1707, 1708 but only including (separated) metal path elements 1715.

It should be noted that the aperture forms may be even more complex than, for example, the fifth aperture form 1705. For example, an aperture form may correspond to a complex interconnect pattern including a multiplicity of contact pads and a multiplicity of metal paths. For example, an aperture form may correspond to the whole interconnect pattern for a printed circuit board.

Using an aperture for the particle deposition device 1600 having the form of an interconnect structure to be formed on a carrier such as a semiconductor wafer, a semiconductor die, or a printed circuit board (PCB) allows easily forming of interconnect structures. Illustratively, an interconnect structure can be formed by using a single spraying burst at the location of the carrier where the interconnect structure to be formed without having to "draw" the interconnect structure (i.e. to move the particle deposition device 1600 with respect to the carrier or to move the carrier with respect to the particle deposition device 1600 while spraying). This is illustrated in FIG. 17.

Figure 18:
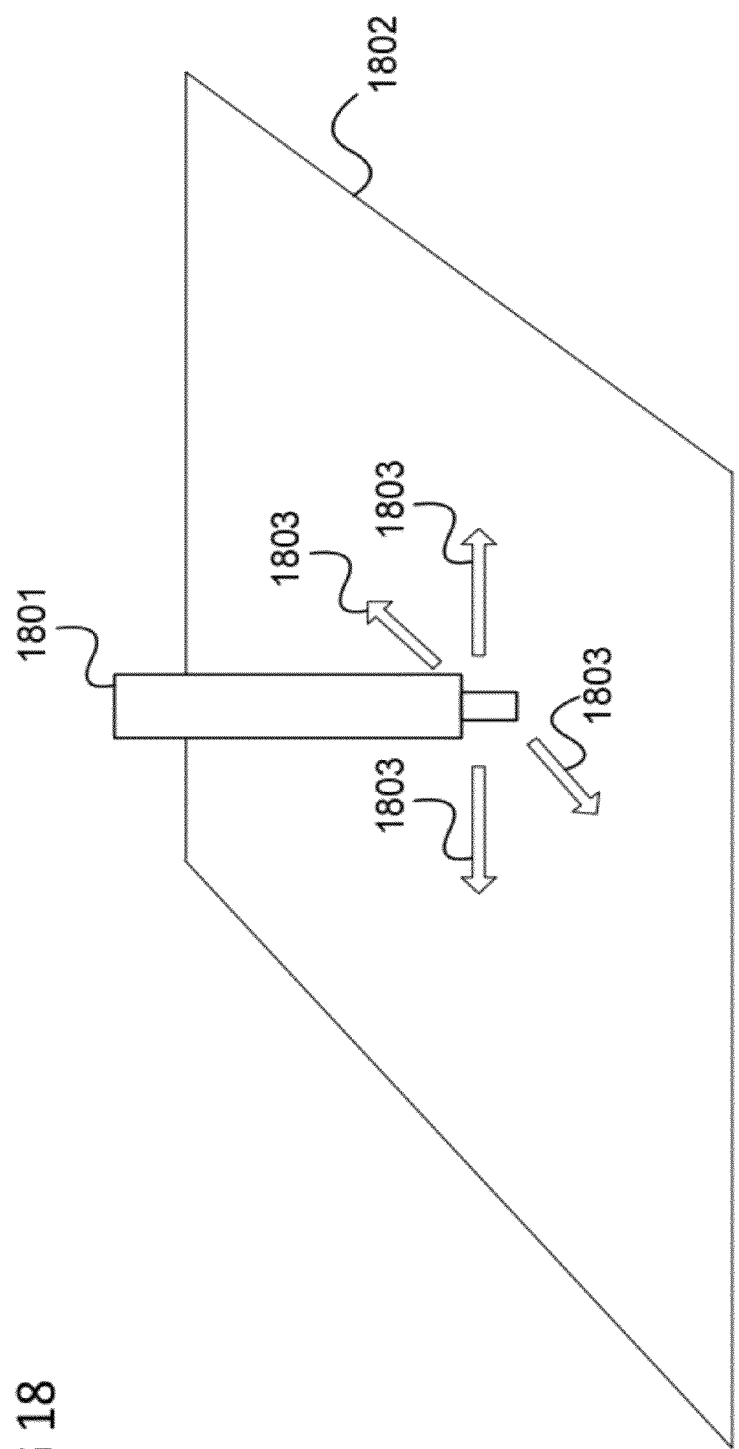
FIG. 18 shows an interconnect forming arrangement according to an embodiment.

FIG. 18 shows an interconnect forming arrangement 1800 according to an embodiment.

The interconnect forming arrangement includes a particle deposition device 1801, for example corresponding to the particle deposition device 1600 described with reference to FIG. 16 and a carrier 1802 onto which an interconnect structure is to be formed.

The particle deposition device 1801 may be moved to a certain location of the carrier 1802, as indicated by arrows 1803, for example by means of a suitable support frame of the particle deposition device 1801. When the particle deposition device 1801 has been moved to a location of the carrier 1802 where an interconnect structure corresponding to the form of the aperture of the particle deposition device 1801, the particle deposition device 1802 is switched on such that it emits the particles to be deposited via an aperture (e.g. a nozzle) of the particle deposition device 1801. After a time depending on the thickness of the layer of the interconnect structure to be deposited the particle deposition device 1802 may be moved to another location of the carrier 1802 where an interconnect structure corresponding to the form of the aperture of the particle deposition device 1801 is to be formed.

In other words, in various embodiments, the particle deposition device 1600 is moved to a location, is switched on for a deposition period, wherein it stays in the location for the deposition period, is switched off after the deposition period, and is then moved to another location and so on. Illustratively, interconnect structures are not drawn onto the carrier by moving the particle deposition device 1600 while being switched on but are formed by alternating the moving of the particle deposition device 1801 with deposition bursts (during which the particle deposition device 1801 is not moving, i.e. hold at a fixed position with respect to the carrier 1802.

It should be noted that in various embodiments, the particle deposition device 1801 may be held at a fixed location and the carrier may be moved between the bursts. In other words, moving the particle deposition device 1801 to a location of the carrier 1802 may be understood to change the relative position of the particle deposition device 1801 and the carrier 1802 such that the particle deposition device 1801 is moved to a location of the carrier 1802 from a viewpoint of the carrier 1802.

In various embodiments, a particle deposition device 1600 may be seen to be provided in which an aperture (e.g. a nozzle or a nozzle head) of, for example, hole-shaped design is replaced by an aperture with a design according to a geometry of a pattern to be deposited.

The particle deposition device 1600 may be used for forming an interconnect structure (e.g. from scratch) or for repairing an interconnect structure that is already present on the carrier. The particle deposition device 1600 may be used for forming an interconnect structure with structure sizes above µm. A form of the aperture (e.g. the nozzle) 1606 and/or the conducting channel 1605 may for example be determined and/or optimized by simulation.

What is claimed is:

1. A method for processing a semiconductor wafer or die comprising supplying particles to a plasma and such that the particles are activated by the plasma;
   spraying the activated particles on the semiconductor wafer or die to generate a particle layer on the semiconductor wafer or die.

2. The method according to claim 1, further comprising patterning the particle layer.

3. The method according to claim 1, wherein the particles are supplied to the plasma by means of a carrier gas.

4. The method according to claim 1, wherein the carrier gas is supplied at atmospheric pressure.

5. The method according to claim 1, further comprising generating the plasma.

6. The method according to claim 5, wherein the plasma is generated at atmospheric pressure.

7. The method according to claim 1, wherein the activated particles are sprayed on the semiconductor wafer or die by means of a conducting channel of a particle deposition device, having an end formed by at least one aperture of the particle deposition device, wherein the aperture has the form of an interconnect structure to be deposited on the semiconductor or die.

8. The method according to claim 1, wherein the activated particles are sprayed on a layer of the semiconductor wafer or die to generate a particle layer reinforcing at least a part of the layer of the semiconductor wafer or die.

9. The method according to claim 8, wherein the activated particles are sprayed on a contact region of the semiconductor wafer or die such that the particle layer reinforces the contact region.

10. The method according to claim 9, wherein the activated are sprayed on a contact region to form a contact pad.

11. The method according to claim 8, wherein the activated particles are sprayed on a semiconductor wafer or die to cover at least one side of the semiconductor or die completely.

12. The method according to claim 8, wherein the activated particles are sprayed on a raw semiconductor wafer or die.

13. The method according to claim 8, wherein the layer of the semiconductor wafer or die is a body layer of the semiconductor wafer or die.

14. The method according to claim 1, wherein particles of at least two materials are supplied to the plasma such that the particles are activated by the plasma and such that a mixture of the activated particles of the at least two materials is formed and wherein the mixture is sprayed on the semiconductor wafer or die to generate a layer comprising a mixture of particles of the at least two materials.

15. The method according to claim 14, wherein the mixture forms a soldering material.

16. The method according to claim 15, wherein the materials are different metals.

17. The method according to claim 1, further comprising patterning a surface of the semiconductor wafer or die, wherein the activated particles are sprayed on the semiconductor wafer or die to generate a particle layer on the patterned semiconductor wafer or die.

18. The method according to claim 17, wherein the surface of the semiconductor wafer or die is patterned to comprise a patterned mask.

19. The method according to claim 18, further comprising patterning the particle layer by means of a Damascene technique.

* * * * *

UNITED STATES PATENT AND TRADEMARK OFFICE
CERTIFICATE OF CORRECTION

| | | |
|---|---|---|
| PATENT NO. | : 8,338,317 B2 | Page 1 of 1 |
| APPLICATION NO. | : 13/080813 | |
| DATED | : December 25, 2012 | |
| INVENTOR(S) | : Manfred Engelhardt et al. | |

It is certified that error appears in the above-identified patent and that said Letters Patent is hereby corrected as shown below:

On the title page, item 75 "Ivan Nikitn" should read -- Ivan Nikitin --

Signed and Sealed this
Nineteenth Day of November, 2013

Teresa Stanek Rea
*Deputy Director of the United States Patent and Trademark Office*